(12) United States Patent
Kim et al.

(10) Patent No.: US 10,770,138 B2
(45) Date of Patent: Sep. 8, 2020

(54) METHOD OF OPERATING RESISTIVE MEMORY DEVICE REDUCING READ DISTURBANCE

(71) Applicant: SAMSUNG ELECTRONICS CO., LTD., Suwon-si, Gyeonggi-do (KR)

(72) Inventors: Hee-Won Kim, Anyang-si (KR); Mu-Hui Park, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/721,372

(22) Filed: Dec. 19, 2019

(65) Prior Publication Data

US 2020/0126617 A1    Apr. 23, 2020

Related U.S. Application Data

(63) Continuation of application No. 16/037,109, filed on Jul. 17, 2018, now Pat. No. 10,546,637.

(30) Foreign Application Priority Data

Jan. 8, 2018  (KR) .................. 10-2018-0002140

(51) Int. Cl.
*G11C 13/00* (2006.01)
*G11C 11/16* (2006.01)
*G11C 11/00* (2006.01)

(52) U.S. Cl.
CPC ........ *G11C 13/004* (2013.01); *G11C 13/0026* (2013.01); *G11C 13/0038* (2013.01);
(Continued)

(58) Field of Classification Search
CPC . G11C 13/004; G11C 13/0026; G11C 13/003; G11C 13/0038; G11C 13/0069;
(Continued)

(56) References Cited

U.S. PATENT DOCUMENTS 7,283,387 B2   10/2007  Cho et al.
7,535,748 B2    5/2009  Shirahama et al.
(Continued)

FOREIGN PATENT DOCUMENTS

JP   2009087433 A   4/2009
KR    100905166    6/2009
KR   1020170078596  7/2017

*Primary Examiner* — Ajay Ojha
(74) *Attorney, Agent, or Firm* — Volentine, Whitt & Francos, PLLC

(57) ABSTRACT

A resistive memory device includes: a memory cell array including resistive memory cells disposed at respective intersections between word lines and bit lines, a first column selection circuit disposed on one side of the memory cell array and configured to selectively connect a bit line connected to a selected memory cell among the resistive memory cells, a second column selection circuit disposed on another side of the memory cell array opposite the first column selection circuit and configured to selectively connect the bit line connected to the selected memory cell, and a control circuit configured to determine a distant column selection circuit from among the first column selection circuit and the second column selection circuit relative to the selected memory cell, and enable the distant column selection circuit during a read operation directed to the selected memory.

20 Claims, 21 Drawing Sheets

(52) U.S. Cl.
CPC .......... *G11C 13/0069* (2013.01); *G11C 11/00* (2013.01); *G11C 11/16* (2013.01); *G11C 13/003* (2013.01); *G11C 13/0004* (2013.01); *G11C 2213/72* (2013.01); *G11C 2213/79* (2013.01)

(58) Field of Classification Search
CPC ............ G11C 13/0004; G11C 2213/72; G11C 2213/79
See application file for complete search history.

(56) References Cited

U.S. PATENT DOCUMENTS

| | | |
|---|---|---|
| 7,940,554 B2 | 5/2011 | Scheuerlein et al. |
| 8,923,040 B2 | 12/2014 | Lin et al. |
| 9,627,052 B1 | 4/2017 | Pellizzer et al. |
| 2017/0162248 A1 | 6/2017 | Matsuoka |
| 2017/0200497 A1 | 7/2017 | Pellizzer et al. |
| 2018/0025778 A1 | 1/2018 | Mori et al. |

FIG. 8A

| X_ADDR | A2 | A1 |
|---|---|---|
| WL1 | 0 | 0 |
| WL2 | 0 | 1 |
| WL3 | 1 | 0 |
| WL4 | 1 | 1 |

WL1, WL2: } Activate Second Column Selection Circuit (130b)
WL3, WL4: } Activate First Column Selection Circuit (130a)

FIG. 8B

| X_ADDR | MSB A10 | A9 | A8 | ... | A2 | A1 |
|---|---|---|---|---|---|---|
| WL1 | 0 | 0 | 0 | ... | 0 | 0 |
| WL2 | 0 | 0 | 0 | ... | 0 | 1 |
| ⋮ | | | | ⋮ | | |
| WL512 | 0 | 1 | 1 | ... | 1 | 1 |
| WL513 | 1 | 0 | 0 | ... | 0 | 0 |
| WL514 | 1 | 0 | 0 | ... | 0 | 1 |
| ⋮ | | | | ⋮ | | |
| WL1024 | 1 | 1 | 1 | ... | 1 | 1 |

WL1–WL512: } Activate Second Column Selection Circuit (130b)
WL513–WL1024: } Activate First Column Selection Circuit (130a)

FIG. 14

| X_ADDR | MSB<br>A10 | MSB_1<br>A9 | A8 | ... | A2 | LSB<br>A1 | |
|---|---|---|---|---|---|---|---|
| WL1 | 0 | 0 | 0 | ... | 0 | 0 | |
| WL2 | 0 | 0 | 0 | ... | 0 | 1 | $V_{LYa}$ |
| ⋮ | | | ⋮ | | | | |
| WL256 | 0 | 0 | 1 | ... | 1 | 1 | |
| WL257 | 0 | 1 | 0 | ... | 0 | 0 | |
| WL258 | 0 | 1 | 0 | ... | 0 | 1 | $V_{LYb}$ |
| ⋮ | | | ⋮ | | | | |
| WL512 | 0 | 1 | 1 | ... | 1 | 1 | |
| WL513 | 1 | 0 | 0 | ... | 0 | 0 | |
| WL514 | 1 | 0 | 0 | ... | 0 | 1 | $V_{LYc}$ |
| ⋮ | | | ⋮ | | | | |
| WL768 | 1 | 0 | 1 | ... | 1 | 1 | |
| WL769 | 1 | 1 | 0 | ... | 0 | 0 | |
| WL770 | 1 | 1 | 0 | ... | 0 | 1 | $V_{LYd}$ |
| ⋮ | | | ⋮ | | | | |
| WL1024 | 1 | 1 | 1 | ... | 1 | 1 | |

$V_{LYa} > V_{LYb} > V_{LYc} > V_{LYd}$

US 10,770,138 B2

METHOD OF OPERATING RESISTIVE MEMORY DEVICE REDUCING READ DISTURBANCE

CROSS-REFERENCE TO RELATED APPLICATION

This application is a Continuation of U.S. application Ser. No. 16/037,109, filed Jul. 17, 2018, which claims the benefit of Korean Patent Application No. 10-2018-0002140, filed on Jan. 8, 2018, in the Korean Intellectual Property Office, the disclosure of which is incorporated herein in its entirety by reference.

BACKGROUND

The inventive concept relates to nonvolatile memory device, and more particularly, to resistive memory devices reducing the possibility of read disturbances. The inventive concept also relates to methods of operating resistive memory devices.

Resistive memories such as phase-change random-access memory (PRAM), resistive RAM (RRAM), and magnetic RAM (MRAM) are well known as nonvolatile memory devices. Resistive memories use a variable resistance element whose resistance state is changed to store data as a memory cell. A cross-point resistive memory device is formed by locating such a memory cell at each of intersections between a plurality of bit lines and a plurality of word lines. In the cross-point resistive memory device, the memory cell is accessed by applying a voltage to both ends of the memory cell, and stores a data value of "1" (low resistance state) or "0" (high resistance state) based on a threshold resistance of the memory cell. During a read operation of the cross-point resistive memory device, current conducted by the memory cell may spike above acceptable levels. Such current spikes may cause read disturbances capable of damaging a resistive memory cell and/or degrading memory system performance.

SUMMARY

The inventive concept provides resistive memory devices, memory systems and methods of operating same that reduce the possibility of read disturbances by limiting current spikes occurring in memory cells during read operations.

In one aspect the inventive concept provides a resistive memory device including; a memory cell array including resistive memory cells disposed at respective intersections between word lines and bit lines, a first column selection circuit disposed on one side of the memory cell array and configured to selectively connect a bit line connected to a selected memory cell among the resistive memory cells, a second column selection circuit disposed on another side of the memory cell array opposite the first column selection circuit and configured to selectively connect the bit line connected to the selected memory cell, and a control circuit configured to determine a distant column selection circuit from among the first column selection circuit and the second column selection circuit relative to the selected memory cell, and enable the distant column selection circuit during a read operation directed to the selected memory.

In another aspect the inventive concept provides a resistive memory device including; a memory cell array including resistive memory cells disposed at respective intersections between word lines and bit lines, a column selection circuit configured to connect a bit line of a selected memory cell from among the resistive memory cells to a data line in response to a column selection signal, and a control circuit configured during a read operation directed to the selected memory cell to variably set a voltage level of the column selection signal in response to a physical distance between the column selection circuit and the selected memory cell.

In another aspect the inventive concept provides a method of operating a memory device comprising a memory cell array including resistive memory cells, a first column selection circuit, and a second column selection circuit, wherein the first and second column selection circuit bracket the memory cell array. The method includes; performing an access operation for selecting a memory cell, determining a distant column selection circuit from among the first column selection circuit and the second column selection circuit relative to the selected memory cell, enabling the distant column selection circuit, transferring a bit line voltage of the selected memory cell to a data line through the enabled, distant column selection circuit, and detecting data stored in the selected memory cell by comparing the bit line voltage with a reference voltage.

BRIEF DESCRIPTION OF THE DRAWINGS

Embodiments of the inventive concept will be more clearly understood from the following detailed description taken in conjunction with the accompanying drawings in which:

FIGS. 8A and 8B are tables further illustrating a method of operating the first and second column selection circuits according to an embodiment of the inventive concept;

FIGS. 13 and 14 are diagrams illustrating in another example of the operation of the memory cell array and the column selection circuit of FIG. 10.

DETAILED DESCRIPTION

Figure 1:
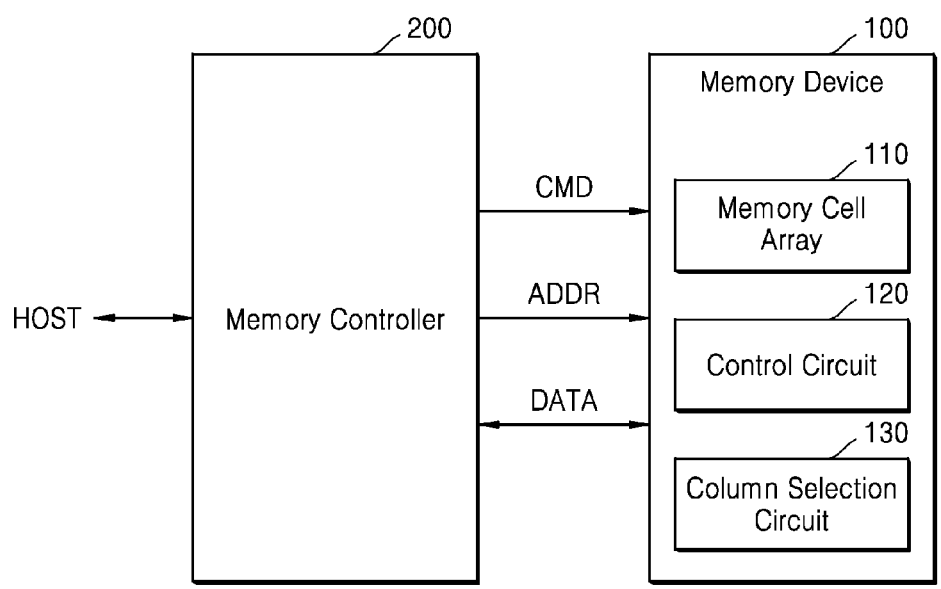
FIG. 1 is a block diagram illustrating a memory system according to an embodiment of the inventive concept.

Figure (FIG. 1 is a block diagram of a memory system 10 illustrating an embodiment inventive concept.

Referring to FIG. 1, the memory system 10 includes a memory device 100 and a memory controller 200, where the memory device 100 further includes a memory cell array 110, a control circuit 120, and a column selection circuit 130.

The memory controller 200 controls the operation of the memory device 100 (e.g., reading data stored in the memory device 100, writing data to the memory device 100, etc.) in response to one or more request(s) received from an external host (HOST), not shown in FIG. 1. Thus, the memory controller 200 may control the execution of a write operation and/or a read operation by the memory device 100 by applying various command CMD and/or address(es) ADDR to the memory device 100. As a result, read data may be retrieved from the memory device 100 using a read operation and/or write data may be written to the memory device using a write operation. In the embodiment illustrated in FIG. 1, read data and/or write data exchanged between the memory controller 200 and memory device 100 are referred to as DATA.

The memory controller 200 may include random-access memory (RAM), a processing unit, a host interface, and a memory interface. The RAM may be used as an operation memory associated with the processing unit, and the processing unit may be used to control the operation of the memory controller 200. The host interface may include a protocol controlling the exchange of data between the host and the memory controller 200. For example, the memory controller 200 may be configured to communicate with the host through at least one of a number of conventionally understood interface protocols such as universal serial bus (USB), multimedia card (MMC), peripheral component interconnection-express (PCI-E), advanced technology attachment (ATA), serial-ATA, parallel-ATA, small computer small interface (SCSI), enhanced small disk interface (ESDI), and integrated drive electronics (IDE).

The memory device 100 of FIG. 1 may be a non-volatile memory device, such as a resistive memory device, wherein the memory cell array 110 includes a plurality of memory cells respectively disposed at intersections between bit lines and word lines. Those skilled in the art will recognize that the memory cell array includes a plurality of word lines and a plurality of bits lines arranged in a substantially rectangular matrix. Each of the resistive memory cells may be a single-level memory cell (SLC) configured to store a single bit of data (1 or 0) according to a selected one of two (2) resistance states. Alternately, each memory cell may be a multi-level memory cell (MLC) configured to store two or more bits of data according to a selected one of multiple resistance states. For example, each MLC may be a two-level memory cell capable of storing two bits of data according to four (4) resistance states, or a three-level memory cell capable of storing three bits of data according to eight (8) resistance states. However, the inventive concept is not limited to only these possibilities, and it is possible that memory cell array 110 may include SLC and MLC, or different types of MLC. In this context, the term "resistive memory cell" denotes a memory cell capable of storing data in relation to two or more resistance levels or resistance states.

That is, each memory cell in the memory cell array 110 may be a resistive memory cell including a variable resistance element whose resistance varies according to stored data. For example, when the variable resistance element is formed of a phase-change material (e.g., Ge—Sb—Te (GST)) and has a resistance that varies according to a temperature, the memory device 100 may be phase-change random-access memory (PRAM). Alternatively, when the variable resistance element includes an upper electrode, a lower electrode, and a complex metal oxide between the upper electrode and the lower electrode, the memory device 100 may be resistive RAM (RRAM). Alternatively, when the variable resistance element includes an upper magnetic electrode, a lower magnetic electrode, and a dielectric material between the upper magnetic electrode and the lower magnetic electrode, the memory device 100 may be magnetic RAM (MRAM).

The control circuit 120 of the memory device 100 may be used to control the execution of various operations (e.g., a program operation, a read operation, and/or an erase operation) in relation to the memory cell array 110. In this regard, the control circuit 120 may control the operation of the column selection circuit 130, such that that a current spike does not occur during "access" (e.g., reading data from, writing data to, etc.) of a selected resistive memory cell in the memory cell array 110. For example, assuming that the column selection circuit 130 includes a first column selection circuit 130a and a second column selection circuit 130b (ref, FIG. 2), the control circuit 120 may control the operation of the column selection circuit 130 according to the physical disposition of a selected resistive memory cell (i.e., the resistive memory cell accessed by a current or ongoing operation). That is, for each access operation the control circuit 120 may identify which one of the first column selection circuit 130a and the second column selection circuit 130b is closest and/or farthest to the selected resistive memory cell, and thereby designate for purposes of the current access operation a "distant" column selection circuit and a "proximate" column selection circuit. With such designations made, the control circuit 120 may then enable the distant column selection circuit and disable the proximate column selection circuit, such that the distant column selection circuit is used to execute the current access operation, as indicated (e.g.,) by one or more address(es) provided to the memory device 100 by the memory controller 200. That is, in certain embodiments of the inventive concept, the distant column selection circuit may be selectively enabled using one or more address bit(s) derived from (e.g.,) a row address.

In this regard, the control circuit 120 may determine relative physical distance(s) between components (e.g., one or more column selection circuits) of the column selection circuit 130 and a selected resistive memory cell using "address information" (e.g., information, such as address bits, derived from a row address and/or a column address). Further with respect to this determination of relative physical distance(s), the control circuit 120 may change a voltage level of a column selection signal. For example, the control circuit 120 may provide a column selection signal having a relatively high voltage when the selected resistive memory cell is relatively distant from the column selection circuit 130. Alternately, the control circuit 120 may provide a column selection signal having a relatively low voltage when the selected resistive memory cell is relatively proximate to the column selection circuit 130.

With respect to the illustrated embodiment of FIG. 1, the memory controller 200 and the memory device 100 may be commonly integrated into a single semiconductor device. For example, the memory controller 200 and the memory device 100 may be integrated into a single semiconductor device having one of many different forms recognized by those skilled in the art.

For example, the memory controller 200 and the memory device 100 may be integrated into a single semiconductor device in a personal computer (PC) card (e.g., personal computer memory card international association (PCMCIA)), a compact flash (CF) card, a smart media card (SM/SMC), a memory stick, a multimedia card (e.g., MMC, reduced-size (RS)-MMC, or MMCmicro), a secure digital (SD) card (e.g., SD, miniSD, or microSD), or a universal flash storage (UFS). Alternatively, the memory controller 200 and the memory device 100 may be integrated into a single semiconductor device such as a solid-state disk/drive (SSD).

Figure 2:
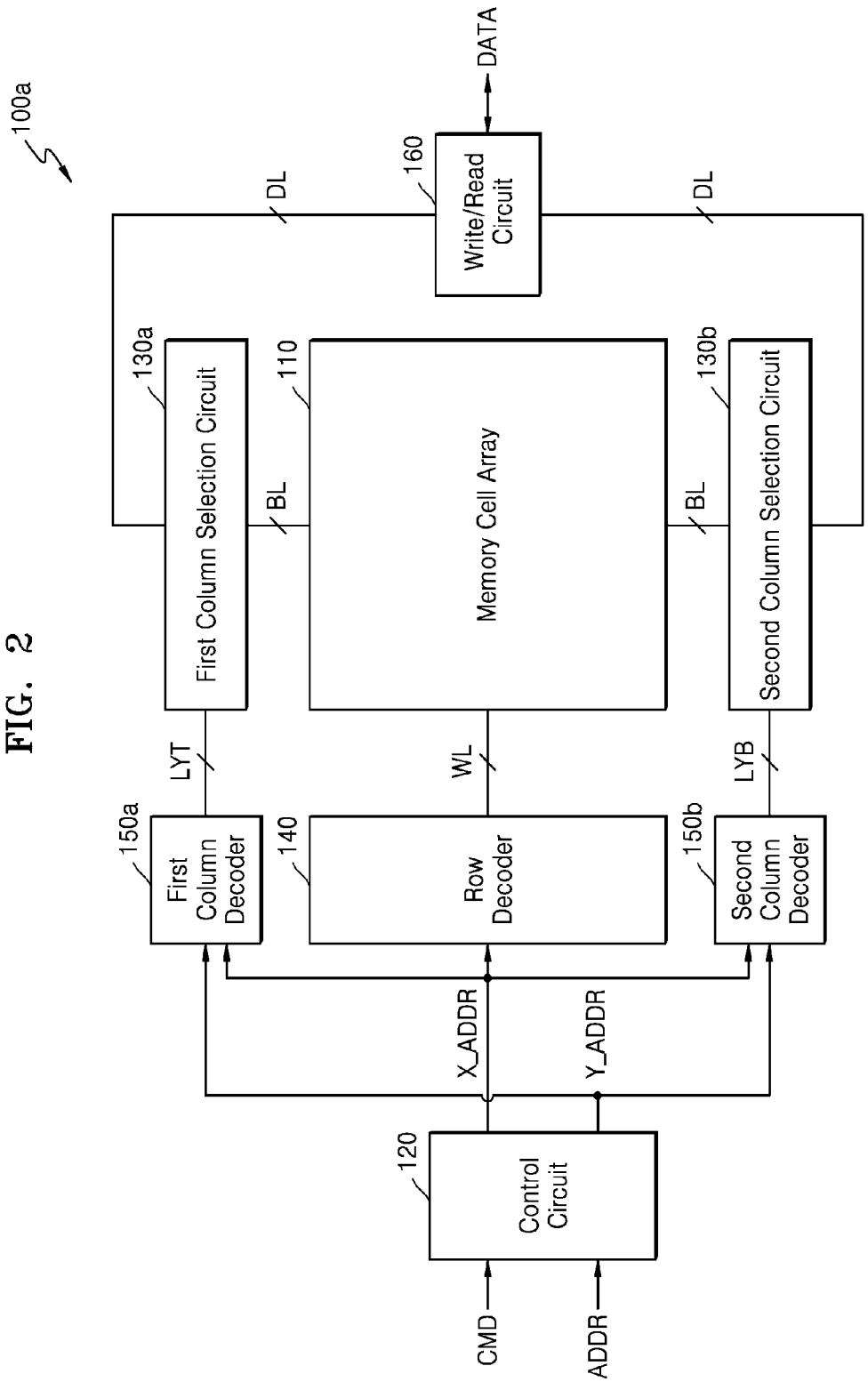
FIG. 2 is a block diagram further illustrating in one example the memory array 110 of FIG. 1 according to an embodiment of the inventive concept.

FIG. 2 is a block diagram further illustrating in one embodiment (100a) the memory device 100 of FIG. 1.

Referring to FIG. 2, the memory device 100a includes the memory cell array 110 and the control circuit 120, as well as first and second column decoders 150a and 150b, first and second column selection circuits 130a and 130b, a row decoder 140, and a write/read circuit 160. In certain embodiments of the inventive concept, the first column selection circuit 130a and the second column selection circuit 130b are disposed on opposing sides of the memory cell array 110. In such a configuration, the first column selection circuit 130a and the second column selection circuit 130b may be said to "bracket" the memory cell array 110.

In the illustrated embodiment of FIG. 2, the first and second column decoders 150a and 150b are physically separated from one another in order to facilitate the bracketing disposition of the first column selection circuit 130a and the second column selection circuit 130b in relation to the memory array 110. However, those skilled in the art will recognize that the first and second column decoders 150a and 150b may be combined in their respective functionality in a common column decoder disposed in any reasonable disposition relative to the first column selection circuit 130a and the second column selection circuit 130b.

As previously noted, the memory cell array 110 may include a plurality of resistive memory cells, where each resistive memory cell is disposed at a respective intersection between a bit line and a word line. For example, the memory cell array 110 may be provided as a cross-point resistive memory cell array having an equivalent circuit diagram shown in FIG. 3.

Figure 3:
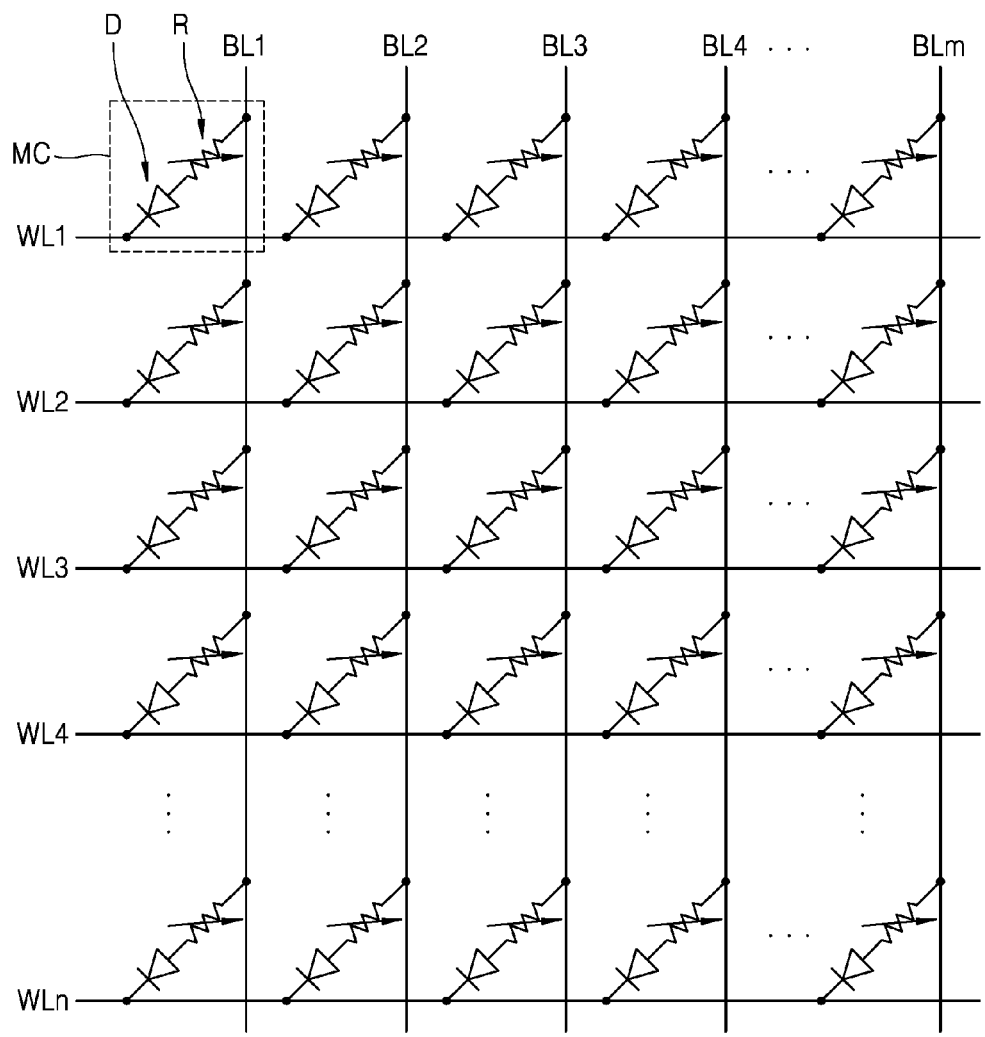
FIG. 3 is an equivalent circuit diagram of a memory cell array of FIG. 2.

The memory cell array 110 may be a horizontal two-dimensional (2D) memory as shown in FIG. 3, and may include a plurality of word lines, e.g., first through $n^{th}$ word lines WL1 through WLn, a plurality of bit lines, e.g., first through $m^{th}$ bit lines BL1 through BLm, and a plurality of resistive memory cells MC. The number of word lines WL, the number of bit lines BL, and the number of resistive memory cells MC may be changed in various ways according to embodiments. However, the inventive concept is not limited thereto, and in another embodiment, the memory cell array 110 may be a vertical three-dimensional (3D) memory.

In the present embodiment, each of the bit lines BL may refer to a line for signal transfer between each of the resistive memory cells MC and a sense amplifier included in the write/read circuit 160. For example, the bit line BL may be defined as a line including a local bit line between the resistive memory cell MC and the first and second column selection circuits 130a and 130b, and a global bit line or a data line between the first and second column selection circuits 130a and 130b and the sense amplifier.

In the present embodiment, each of the plurality of resistive memory cells MC may be a 1D1R resistive memory cell including a variable resistance element R and a selection element D. The variable resistance element R may be referred to as a variable resistance material, and the selection element D may be referred to as a switching element.

In an embodiment, the variable resistance element R may be connected between one of the first through $m^{th}$ bit lines BL1 through BLm and the selection element D, and the selection element D may be connected between the variable resistance element R and one of the first through $n^{th}$ word lines WL1 through WLn. However, the inventive concept is not limited thereto, and the selection element D may be connected between one of the first through $m^{th}$ bit lines BL1 through BLm and the variable resistance element R, and the variable resistance element R may be connected between the selection element D and one of the first through $n^{th}$ word lines WL1 through WLn.

The variable resistance element R may be changed to one from among a plurality of resistance states due to an applied electrical pulse. In an embodiment, the variable resistance element R may include a phase-change material whose crystal state is changed according to the amount of current. The phase-change material may be any of various materials such as a compound of two elements (e.g., GaSb, InSb, InSe, Sb2Te3, or GeTe), a compound of three elements (e.g., GeSbTe, GaSeTe, InSbTe, SnSb2Te4, or InSbGe), or a compound of four elements (e.g., AgInSbTe, (GeSn)SbTe, GeSb(SeTe), or Te81Ge15Sb2S2).

The phase-change material may have an amorphous state exhibiting a relatively high resistance and a crystal state exhibiting a relatively low resistance. A phase of the phase-change material may be changed according to Joule's heat generated according to the amount of current. Data may be written by using such a phase change.

In another embodiment, the variable resistance element R may include perovskite compounds, transition metal oxides, magnetic materials, ferromagnetic materials, or antiferromagnetic materials, instead of the phase-change material.

The selection element D may be connected between any one of the first through $n^{th}$ word lines WL1 through WLn and the variable resistance element R, and may control current supply to the variable resistance element R according to a voltage applied to the connected word line and a bit line. Although the selection element D is a diode in FIG. 3, it is exemplary, and in another embodiment, the selection element D may be changed to another switchable element.

Referring back to FIG. 2, the control circuit 120 may be used to provide various control signals during access operations directed to resistive memory cells of the memory cell array 110 (e.g., write operations writing data to the memory cell array 110 and/or read operations reading the data from the memory cell array 110, hereafter singularly or collectively referred to as "read/write operations") in response to command CMD and/or address(es) ADDR received from the memory controller 200. The control signals provided by the control circuit 120 may be variously applied to the row decoder 140, the first and second column decoders 150a and 150b, and/or the write/read circuit 160.

In this regard, the control circuit 120 may apply various control signals to the write/read circuit 160 during read/write operations. For example, the control circuit 120 may apply a voltage control signal CTRL_VOL (see FIG. 10) to a voltage generator 170 (see FIG. 10), and the voltage generator 170 may generate a variety of voltages variously used to execute a write operation, a read operation, and/or an erase operation in relation to selected memory cell(s) of the memory cell array 110 in response to the voltage control signal CTRL_VOL.

The control circuit 120 may apply a row address X_ADDR from among the addresses ADDR received from the memory controller 200 to the row decoder 140, and may apply a column address Y_ADDR from among the addresses ADDR to the first and second column decoders 150a and 150b. The row decoder 140 may be connected to the memory cell array 110 through the plurality of word lines WL, and may select a word line WL corresponding to the row address X_ADDR received from the control circuit 120. The row decoder 140 may control voltage(s) applied to the selected word line and/or non-selected word lines.

The control circuit 120 may also control the operation of the first and second column decoders 150a and 150b in such a manner that the risk of a current spike occurring is reduced. For example, during a read operation, the control circuit 120 may selectively control the operation of the first and second column decoders 150a and 150b by enabling a distant column selection circuit from among the first and second column selection circuits 130a and 130b and disabling a proximate column selection circuit from among the first and second column selection circuits 130a and 130b relative to the selected resistive memory cell(s).

The first and second column decoders 150a and 150b may be connected to the first and second column selection circuits 130a and 130b, and the first and second column selection circuits 130a and 130b may be connected to the memory cell array 110 through the plurality of bit lines BL. The first column selection circuit 130a and the second column selection circuit 130b may be disposed on the perimeter of the memory cell array 110. The first column selection circuit 130a and the second column selection circuit 130b may be disposed on opposite sides in order to bracket the memory cell array 110. Assuming for illustrative purposes only the layout of components shown in FIG. 2, the first column selection circuit 130a may be understood as being "above" the memory cell array 110 while the second column selection circuit 130b is understood as being below the memory cell array 110. Of course in this regard, the relative dispositional relationships between the first and second column section circuits 130a and 130b and the memory cell array 110 are entirely arbitrary. Thus, in different embodiments, the "above" and "below" dispositions may be reversed, or re-envisioned at 90° as having "left" and "right" relationships relative to the memory cell array 110.

The first and second column decoders 150a and 150b may control respective connection relationship between the first and second column selection circuits 130a and 130b to select a bit line BL in response to the column address Y_ADDR and a predetermined address bit of the row address X_ADDR received from the control circuit 120. For example, the first and second column decoders 150a and 150b may generate a first column selection signal LYT and a second column selection signal LTB in response to the column address Y_ADDR.

The first and second column decoders 150a and 150b may selectively enable the first or second column selection circuit 130a or 130b in order to reduce the possibility of a current spike occurring in relation to the selected memory cell during read/write operations. That is, the first and second column decoders 150a and 150b may generate the first column selection signal LYT and/or the second column selection signal LTB to enable a distant column selection circuit and disable a proximate column selection circuit using the predetermined address bit of the row address X_ADDR. The first and second column decoders 150a and 150b may control a connection relationship of the selected bit line using the first column selection signal LYT and/or the second column selection signal LTB as indicated by the first and second column decoders 150a and 150b.

The write/read circuit 160 may be connected to the selected bit line BL and may perform a write operation by applying a write pulse to the selected memory cell. In this manner, the write/read circuit 160 may control the writing of data to the memory cell array 110. Here, the write pulse may be a current pulse or a voltage pulse.

The write/read circuit 160 may also be connected to the selected bit line BL and may perform a read operation with respect to data stored in the selected memory cell.

In the embodiment illustrated in FIG. 2, the write/read circuit 160 is connected to the first and second column selection circuits 130a and 130b, and thus may be connected to the bit lines BL. However, the inventive concept is not limited thereto, and in another embodiment, the write/read circuit 160 may be connected to the row decoder 140, and thus may be connected to the word lines WL.

Figure 4A:
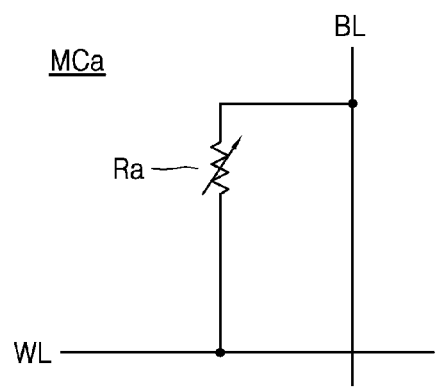
FIGS. 4A, 4B and 4C are respective circuit diagrams illustrating possible implementation variations for the memory cell of FIG. 3.
Figure 4B:
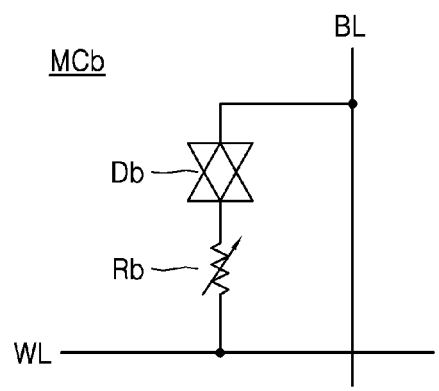
Figure 4C:
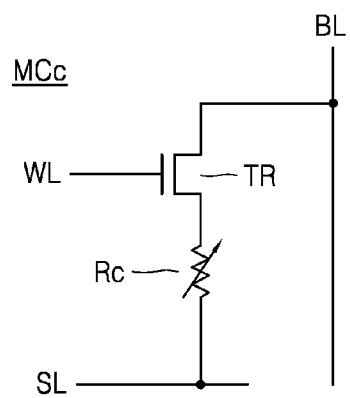

FIGS. 4A, 4B and 4C are respective circuit diagrams illustrating possible variations to the implementation for the resistive memory cell MC of FIG. 3.

Referring to FIG. 4A, a resistive memory cell MCa may include a variable resistance element Ra, and the variable resistance element Ra may be connected between the bit line BL and the word line WL. The resistive memory cell MCa may store data by using voltages applied to the bit line BL and the word line WL.

Referring to FIG. 4B, a resistive memory cell MCb may include a variable resistance element Rb and a bidirectional diode Db. The variable resistance element Rb may include a resistance material for storing data. The bidirectional diode Db may be connected between the variable resistance element Rb and the word line WL, and the variable resistance element Rb may be connected between the bit line BL and the bidirectional diode Db. Positions of the bidirectional diode Db and the variable resistance element Rb may be reversed. Leakage current flowing through non-selected resistance cells may be cut off due to the bidirectional diode Db.

Referring to FIG. 4C, a resistive memory cell MCc may include a variable resistance element Rc and a transistor TR. The transistor TR may be a selection element, that is, a switching element, for supplying or cutting off current to the variable resistance element Rc according to a voltage of the word line WL. In FIG. 4C, a source line SL for adjusting a voltage level at both ends of the variable resistance element Rc may be further provided, in addition to the word line WL. The transistor TR may be connected between the variable resistance element Rc and the source line SL, and the variable resistance element Rc may be connected between the bit line BL and the transistor TR. Positions of the transistor TR and the variable resistance element Rc may be reversed. The resistive memory cell MCc may be selected or may not be selected according to whether the transistor TR driven by the word line WL is turned on or off.

Figure 5A:
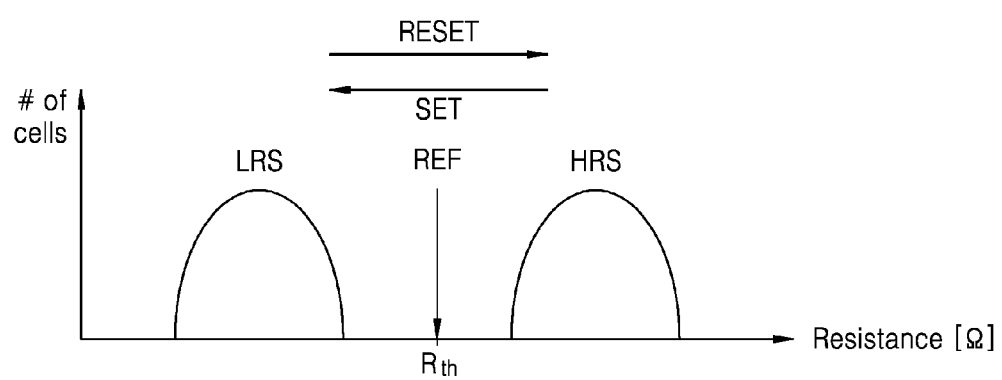
FIGS. 5A, 5B and 5C are graphs illustrating distribution of memory cells according to a resistance when the memory cell of FIG. 3 is a single-level cell.
Figure 5B:
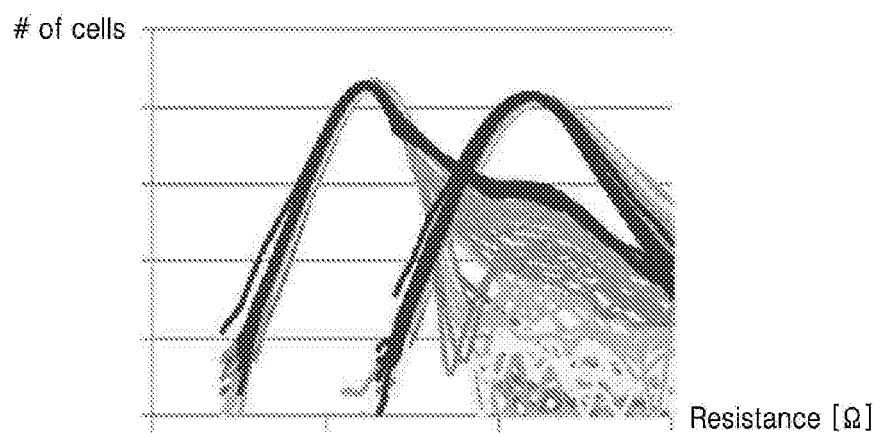
Figure 5C:
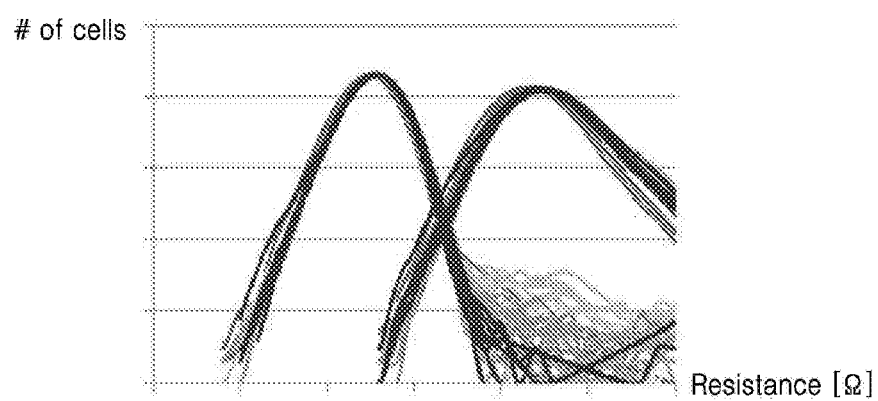

FIGS. 5A, 5B and 5C are graphs illustrating a distribution of resistive memory cells according to resistance when the resistive memory cell MC of FIG. 3 is a single-level cell. In FIGS. 5A, 5B and 5C, the horizontal axis indicates resistance and the vertical axis indicates a number of resistive memory cells.

FIG. 5A illustrates an ideal distribution of single-level cells in which a resistive memory cell is programmed with 1 bit. The variable resistance element R of a resistive memory cell may have a low resistance state LRS or a high resistance state HRS. An operation of switching the variable resistance element R from the high resistance state HRS to the low resistance state LRS by applying a write pulse to the resistive memory cell is referred to as a set operation or a set write operation. Also, an operation of switching the variable resistance element R from the low resistance state LRS to the high resistance state HRS by applying a write pulse to the resistive memory cell is referred to as a reset operation or a reset write operation.

An arbitrary resistance between a distribution of the low resistance state LRS and a distribution of the high resistance state HRS may be set as a threshold resistance $R_{th}$. During a read operation directed to resistive memory cells, it may be determined that a resistance state is the high resistance state HRS when a read result is equal to or greater than the threshold resistance $R_{th}$ and is the low resistance state LRS when the read result is less than the threshold resistance $R_{th}$.

Referring to FIG. 5B, during a conventional read operation directed to resistive memory cells, a precharge voltage is applied to a selected bit line and a ground voltage is applied to a selected word line, thereby causing current to flow through a selected memory cell. In this case, it has been determined that a resistance deviation of the variable resistance element R is caused by read disturbance due to a current spike occurring in the selected memory cell, and in particular, a distribution of the low resistance state LRS is shown in a wide range. When a range of the distribution of the low resistance state LRS is widened, a resistance of the low resistance state LRS may exceed the threshold resistance $R_{th}$, thereby leading to a read error.

Referring to FIG. 5C, it has been determined that in order to reduce read disturbance due to a current spike occurring in a resistive memory cell, a range of a distribution of the low resistance state LRS is reduced, which is obtained after performing embodiments of FIGS. 6 through 15. A method of reducing read disturbance due to a current spike occurring in a resistive memory cell will be described below in more detail.

Figure 6:
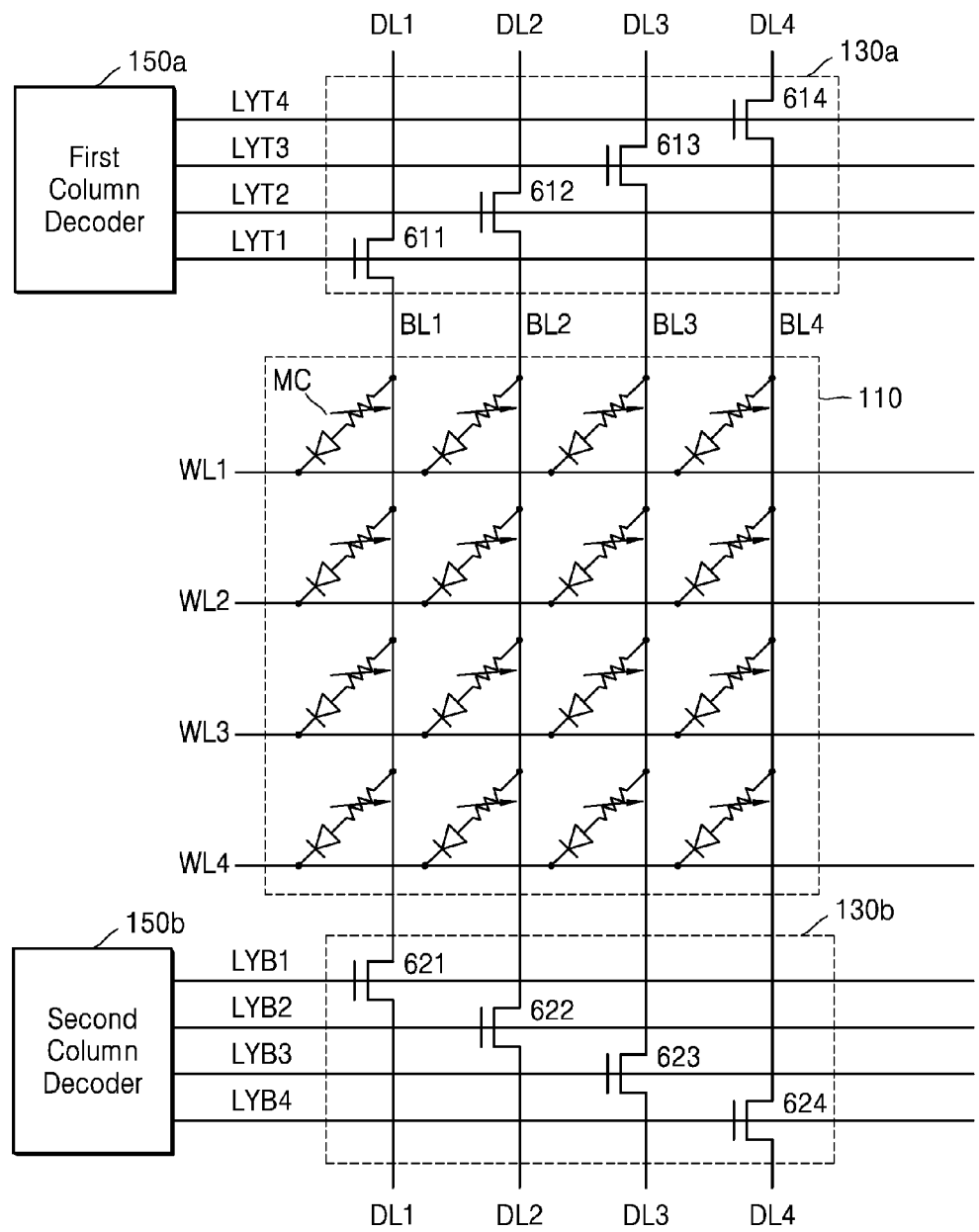
FIGS. 6, 7A and 7B are circuit diagrams further illustrating in one example the operation of the memory cell array and first and second column selection circuits of FIG. 2.

FIG. 6 is a circuit diagram further illustrating the memory cell array 110, the first column selection circuit 130a, and the second column selection circuit 130b of FIG. 2.

Referring to FIG. 6, in the memory cell array 110, the resistive memory cells MC are disposed at respective intersections between four word lines (e.g., first through fourth word lines—WL1, WL2, WL3, and WL4) and four bit lines (e.g., first through fourth bit lines—BL1, BL2, BL3, and BL4). The first column selection circuit 130a includes first column selection transistors 611, 612, 613, and 614 disposed on one side (e.g., above) of the periphery of the memory cell array 110, and respectively connected to the first through fourth bit lines BL1, BL2, BL3, and BL4. The second column selection circuit 130b includes second column selection transistors 621, 622, 623, and 624 disposed on another side (e.g., below) of the memory cell array 110, opposite the side on which the first column selection circuit 130a is disposed, and respectively connected to the first through fourth bit lines BL1, BL2, BL3, and BL4. Those skilled in the art will recognize that the choice of a particular side or periphery portion of the memory cell array 110 at which a column selection circuit is disposed is an arbitrary design choice, so long as the first column selection circuit 130a and the second column selection circuit 130b are disposed on opposing sides to effectively bracket the memory cell array 110.

The first column selection transistors 611, 612, 613, and 614 may be respectively connected to first column selection signals LYT1, LYT2, LYT3, and LYT4 applied from the first column decoder 150a. The first through fourth bit lines BL1, BL2, BL3, and BL4 selected through the first column selection transistors 611, 612, 613, and 614 that are turned ON in response to the first column selection signals LYT1, LYT2, LYT3, and LYT3 may be connected to data lines DL1, DL2, DL3, and DL4.

The second column selection transistors 621, 622, 623, and 624 may be respectively connected to second column selection signals LYB1, LYB2, LYB3, and LYB4 applied from the second column decoder 150b. The first through fourth bit lines BL1, BL2, BL3, and BL4 selected through the second column selection transistors 621, 622, 623, and 624 that are turned ON in response to the second column selection signals LYB1, LYB2, LYB3, and LYB4 may be connected to the data lines DL1, DL2, DL3, and DL4.

The first column selection signals LYT1, LYT2, LYT3, and LYT4 and the second column selection signals LYB1, LYB2, LYB3, and LYB4 may be generated to enable either the first column selection circuit 130a or the second column selection circuit 130b depending on a determination as to which if these two components is more distant from the selected memory cell(s). Thus, the first through fourth bit lines BL1, BL2, BL3, and BL4 of the memory cells selected through the distant one of the first and second column selection circuit 130a or 130b will be connected to the data lines DL1, DL2, DL3, and DL4.

A more particular example of the foregoing will now be described in relation to FIG. 7A assuming that a resistive memory cell MC disposed at an intersection between the first word line WL1 and the first bit line BL1 in the memory cell array 110 of FIG. 6 is selected during a read operation.

Figure 7A:
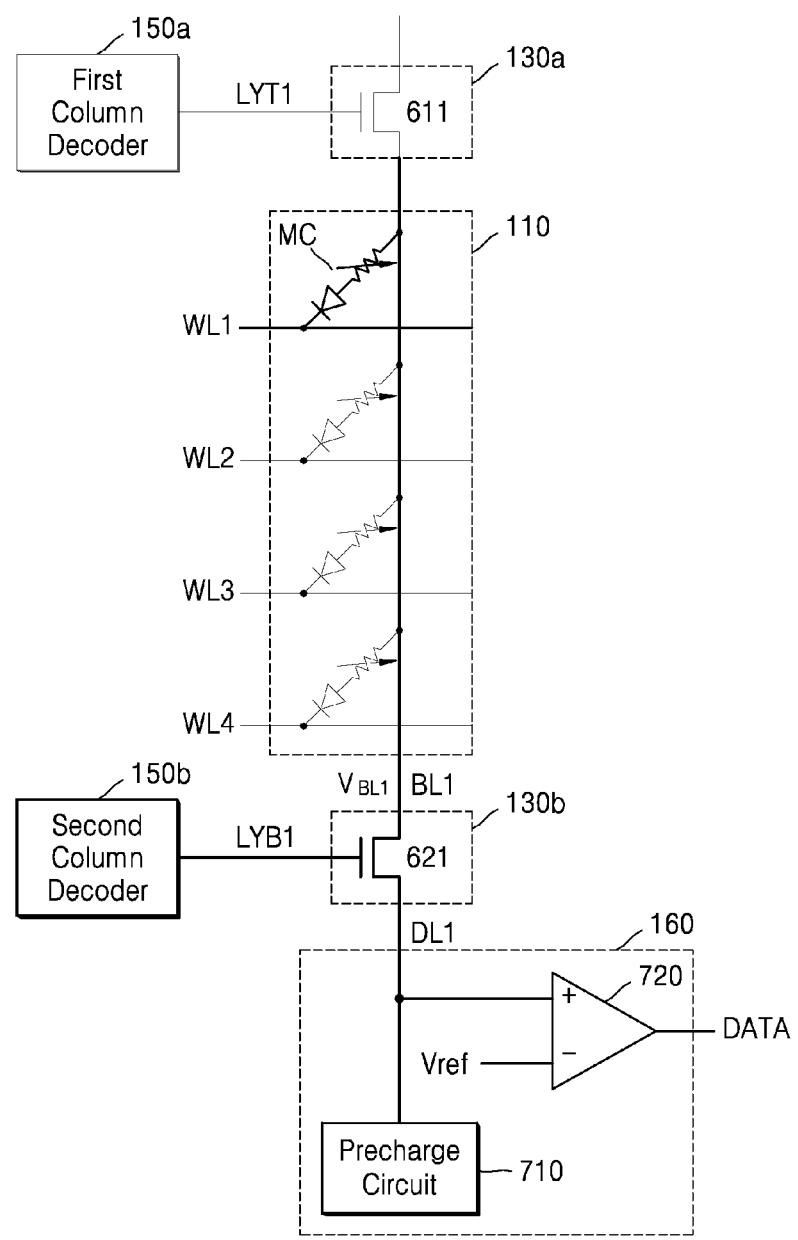

Referring to FIG. 7A, the second column selection circuit 130b is determined to be the distant column selection circuit relative to the selected memory cell MC and is therefore enabled. Accordingly, the second column selection signal LYB1 is activated, the second column selection transistor 621 is turned ON in response to the second column selection signal LYB1, and the first bit line BL1 and the first data line DL1 are connected through the turned ON second column selection transistor 621.

The selected memory cell MC is accordingly connected to the write/read circuit 160 through the first data line DL1. The write/read circuit 160 may include a precharge circuit 710 and a sense amplifier 720. The precharge circuit 710 may precharge the first data line DL1 to a precharge voltage level during a precharge period. When the precharge period ends and a develop period for sensing the selected memory cell MC starts, the precharge circuit 710 may be inactivated, and the precharge operation on the first data line DL1 ends. The sense amplifier 720 may detect data stored in the selected memory cell MC by comparing a voltage level of the first data line DL1 with a reference voltage Vref. The reference voltage Vref may be applied from the voltage generator 170 (see FIG. 10) of the memory device 100a.

Since the selected memory cell MC is relatively distant from the second column selection circuit 130b, the bit line BL between the selected memory cell MC and the second column selection circuit 130b is relatively long, and the corresponding bit line resistance $R_{BL}$ is relatively large. During a read operation, the possibility of a current spike occurring in the selected memory cell MC may be reduced due to the IR voltage drop associated with the relatively large bit line resistance $R_{BL}$. When the voltage of the first word line WL1 is substantially at ground level, a voltage of the selected memory cell MC (i.e., the cell voltage) will correspond to a first bit line voltage $V_{BL1}$. The first bit line voltage $V_{BL1}$ may be transferred to the first data line DL1 through the second column selection transistor 621.

The sense amplifier 720 may then compare a voltage level of the first data line DL1 with the reference voltage Vref. The sense amplifier 720 may output a data value of "1" indicating that the selected memory cell MC has a high resistance state HRS as the data when the voltage level of the first data line DL1 is higher than the reference voltage Vref, and may output a data value of "0" indicating that the selected memory cell MC has a low resistance state LRS as the data when the voltage level of the first data line DL1 is lower than the reference voltage Vref.

A second comparative example will now be described with reference to FIG. 7B assuming that a memory cell MC disposed at an intersection between the fourth word line WL4 and the first bit line BL1 in the memory cell array 110 of FIG. 6 is selected during a read operation.

Figure 7B:
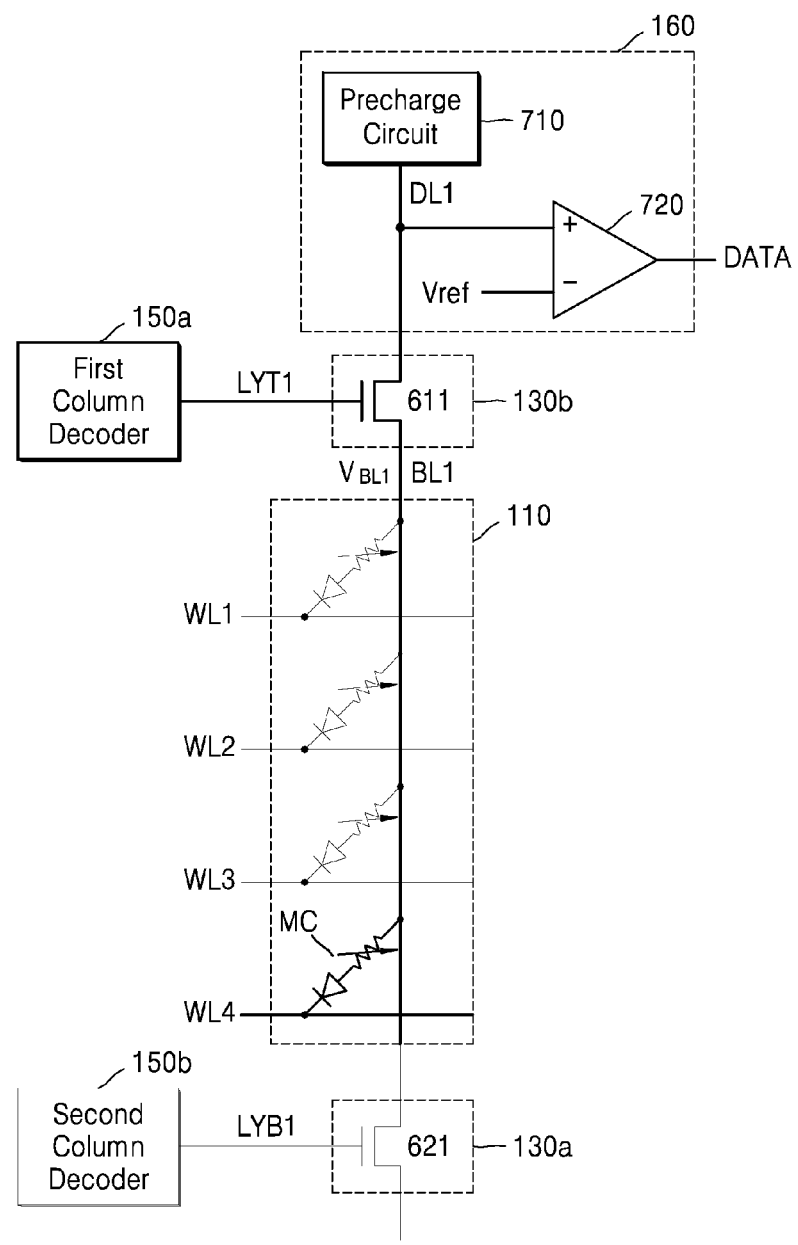

Referring to FIG. 7B, the first column selection circuit 130a is now determined to be the distant column selection circuit relative to the selected memory cell MC and is therefore enabled. Accordingly, the first column selection signal LYT1 is activated, the first column selection transistor 611 is turned ON in response to the first column selection signal LYT1, and the first bit line BL1 and the first data line DL1 are connected through the turned ON first column selection transistor 611.

As a result, the selected memory cell MC is connected to the write/read circuit 160 through the first data line DL1. The precharge circuit 710 of the write/read circuit 160 may precharge the first data line DL1 to a precharge voltage level during a precharge period, and when the develop period for sensing the selected memory cell MC starts, a precharge operation on the first data line DL1 may end. The sense amplifier 720 may detect data stored in the selected memory cell MC by comparing a voltage level of the first data line DL1 with the reference voltage Vref.

Here again, since the selected memory cell MC is relatively distant from the first column selection circuit 130a, the bit line BL between the selected memory cell MC and the first column selection circuit 130a is relatively long, and the corresponding bit line resistance $R_{BL}$ is relatively large. During a read operation, the possibility of a current spike occurring in the selected memory cell MC may be limited due to the IR voltage drop associated with the relatively large bit line resistance $R_{BL}$. Further assuming that the voltage of the fourth word line WL4 is substantially at ground voltage, the voltage of the selected memory cell MC (i.e., cell voltage) will correspond to the first bit line voltage $V_{BL1}$. The first bit line voltage $V_{BL1}$ may be transferred to the first data line DL1 through the first column selection transistor 611.

The sense amplifier 720 may output a data value of "1" indicating that the selected memory cell MC has the high resistance state HRS as the data when a voltage level of the first data line DL1 is higher than the reference voltage Vref, and may output a data value of "0" indicating that the selected memory cell MC has the low resistance state LRS as the data when the voltage level of the first data line DL1 is lower than the reference voltage Vref.

FIGS. 8A and 8B are respective tables illustrating method(s) of operating the first and second column selection circuits 130a and 130b according to embodiments of the inventive concept.

Referring to FIGS. 2, 6 and 8A, the first through fourth word lines WL1, WL2, WL3, and WL4 may be accessed using first and second address bits A1 and A2 of the row address X_XDR applied from the control circuit 120. The first word line WL1 may be accessed when the row address bits A1 and A2 are "00", the second word line WL2 may be accessed when the row address bits A1 and A2 are "01", the third word line WL3 may be accessed when the row address bits are "10", and the fourth word line WL4 may be accessed when the row address bits A1 and A2 are "11".

When memory cells connected to the first and second word lines WL1 and WL2 are selected, the second column selection circuit 130b will be distant from the selected memory cells and will therefore be enabled. In contrast, when memory cells connected to the third and fourth word lines WL3 and WL4 are selected, the first column selection circuit 130a will be distant from the selected memory cells and will therefore enabled.

In order to enable the distant column selection circuit relative to the selected memory cells, the control circuit 120 may apply the address bit A2 of the row address X_ADDR along with the column address Y_ADDR to the first and second column decoders 150a and 150b. The first and second column decoders 150a and 150b may selectively activate the first column selection signals LYT1 through LYT4 or the second column selection signals LYB1 through LYB4 by using information of the address bit A2. The distant one of the first and second column selection circuit 130a or 130b relative to the selected memory cells may be enabled by the activated first column selection signals LYT1 through LYT4 or second column selection signals LYB1 through LYB4.

According to certain embodiments of the inventive concept, the control circuit 120 may selectively enable a column decoder connected to the distant column selection circuit from among the first and second column decoders 150a and 150b by using the address bit A2 of the row address X_ADDR. The enabled first or second column decoder 150a or 150b may activate the first column selection signals LYT1 through LYT4 or the second column selection signals LYB1 through LYB4 according to the column address Y_ADDR input from the control circuit 120. In this manner, the distant one of the first and second column selection circuit 130a or 130b may be enabled by the activated first column selection signals LYT1 through LYT4 or second column selection signals LYB1 through LYB4.

Referring to FIGS. 2, 6 and 8B, the row address X_ADDR includes address bits A1 through A10. The first through 1024$^{th}$ word lines WL1 through WL1024 of the memory cell array 110 that are selected word lines may be activated according to the address bits A1 through A10. In this case, the control circuit 120 may apply the address bit A10, which is an MSB address bit, of the row address X_ADDR to the first and second column decoders 150a and 150b. The first and second column decoders 150a and 150b may activate a first column selection signal LYTi (where 'i' is a natural number) or a second column selection signal LYBi (where 'i' is a natural number) using the address bit A10 to enable the first or second column selection circuit 130a or 130b relatively distant from the selected memory cells.

For example, when memory cells connected to word lines of a first group including the first through 512$^{th}$ word lines WL1 through WL512 are selected, the second column selection circuit 130b is distant from the selected memory cells may be enabled. When memory cells connected to word lines of a second group including the 513$^{th}$ through 1024$^{th}$ word lines WL513 through WL1024 are selected, the first column selection circuit 130a is distant from the selected memory cells may be enabled.

According to certain embodiments of the inventive concept, the first column selection circuit 130a will be relatively distant from the first through 512$^{th}$ word lines WL1 through WL512 of the memory cell array 110, and the second column selection circuit 130b will be relatively distant from the 513$^{th}$ through 1024$^{th}$ word lines WL513 through WL1024. In this case, when memory cells connected to word lines of a first group including the first through 512$^{th}$ word lines WL1 through WL512 are selected, the first column selection circuit 130a will be distant and will therefore be enabled. And when memory cells connected to word lines of a second group including the 513 through 1024 word lines WL513 through WL1024 are selected, the second column selection circuit 130b will be distant and will therefore be enabled.

Figure 9:
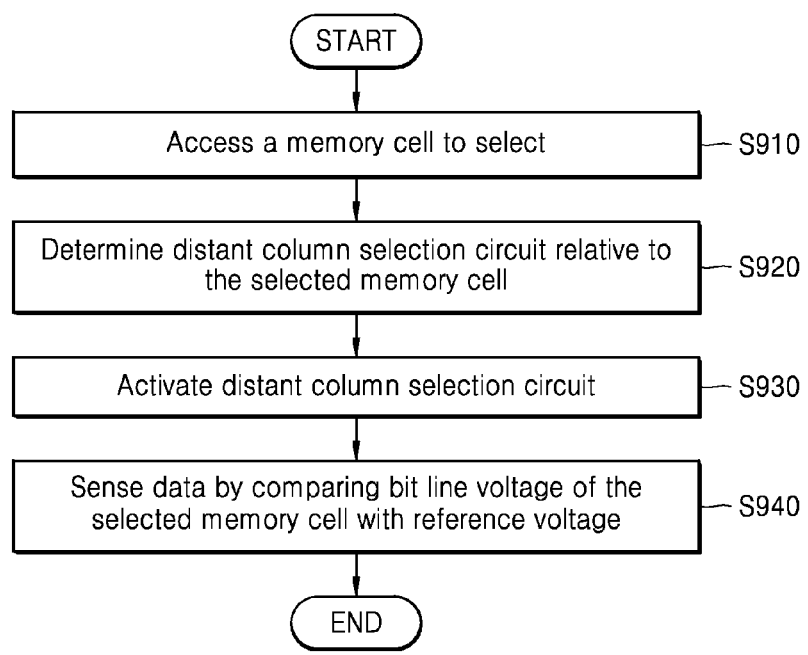
FIG. 9 is a flowchart summarizing a method of operating a memory device according to an embodiment of the inventive concept.

FIG. 9 is a flowchart summarizing a method of operating a memory device according to an embodiment of the inventive concept.

Referring to FIG. 9, in the context of the foregoing description provided with reference to FIGS. 1 through 8B inclusive, the exemplary method of operating the memory device assumes the execution of a read operation on selected memory cells.

In operation S910, an access operation for selecting a memory cell may be performed. The access operation may include controlling to receive the addresses ADDR applied from the memory controller 200, select the word line WL according to the row address X_ADDR of the received addresses ADDR, and select the bit line BL according to the column address Y_ADDR.

In operation S920, a determination is made as to whether the first column selection circuit 130a or the second column selection circuit 130b is distant from the selected memory cells. A predetermined address bit of the row address X_ADDR may be used to determine whether the column selection circuit 130a or 130b is relatively distant from the selected memory cell.

In operation S930, the distant column selection circuit (130a or 130b) is enabled. Accordingly, since a physical distance between the selected memory cell and the enabled column selection circuit 130a or the 130b is relatively large, a corresponding bit line resistance for the selected memory cell may be increased, and thus the possibility of a current spike occurring in the selected memory cell MC is reduced limited due to the relatively large an IR voltage drop caused by the bit line resistance.

In operation S940, data stored in the selected memory cell may be detected by comparing a reference voltage with a bit line voltage of the selected memory cell according to the high resistance state HRS or the low resistance state LRS of the selected memory cell.

Figure 10:
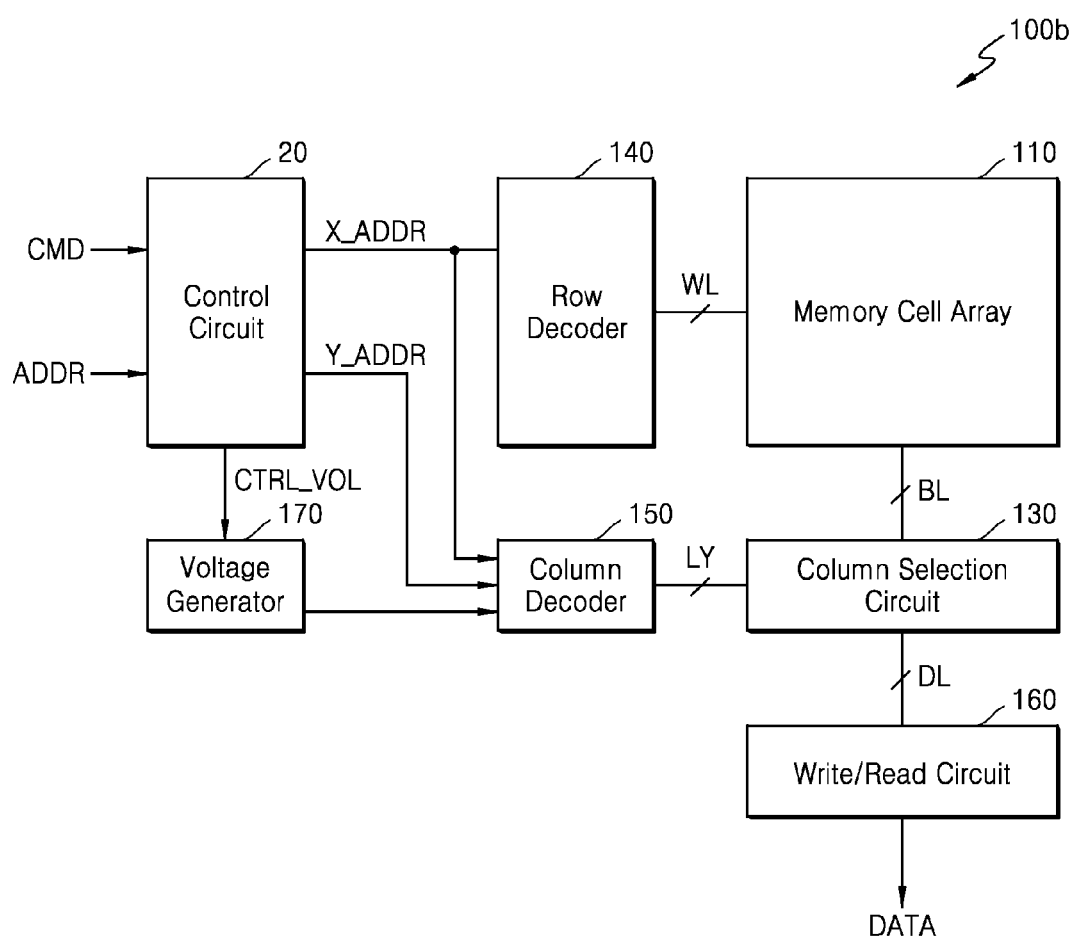
FIG. 10 is a block diagram illustrating another memory device according to an embodiment of the inventive concept.

FIG. 10 is a block diagram illustrating in another example (100b) of the memory device 100 of FIG. 1 according to embodiment of the inventive concept.

Referring to FIG. 10, the memory device 100b include the memory cell array 110, the control circuit 120, the selection circuit 130, the row decoder 140, a column decoder 150, the write/read circuit 160, and the voltage generator 170.

Here, the memory device 100b includes substantially similar components as those described above in relation to memory device 100a of FIG. 2, except for differences set forth hereafter with respect to the column selection circuit 130, the column decoder 150, and the voltage generator 170.

The memory cell array 110 may include the first through n$^{th}$ word lines WL1 through WLn, the first through m$^{th}$ bit lines BL1 through BLm, and the plurality of memory cells MC, as shown in FIG. 3. Each of the plurality of memory cells MC may include the variable resistance element R and the selection element D. The control circuit 120 may control the write/read circuit 160 to write the data to the memory cell array 110 or read the data from the memory cell array 110, based on the command CMD and the addresses ADDR received from the memory controller 200 (see FIG. 1).

The row decoder 140 may be connected to the memory cell array 110 through the plurality of word lines WL, and may select a word line WL according to the row address X_ADDR received from the control circuit 120. The column decoder 150 may enable the column selection circuit 130 to select a bit line BL based on the column address Y_ADDR and predetermined address bits of the row address X_ADDR received from the control circuit 120. The memory cell MC disposed at an intersection between the selected word line WL and the selected bit line BL may be selected.

The column decoder 150 may generate a column selection signal LY in response to the column address Y_ADDR and the predetermined address bits of the row address X_ADDR. The column decoder 150 may change a voltage level of the column selection signal LY in response (or in proportion) to a physical distance between the selected memory cell MC and the column selection circuit 130, in order to reduce the possibility of a current spike occurring in the selected memory cell MC during a read operation. For example, the column decoder 150 may determine the physical distance between the word line WL of the selected memory cell MC and the column selection circuit 130 using predetermined bit(s) of the row address X_ADDR.

When the selected memory cell MC is relatively distant from the column selection circuit 130, the bit line BL connected to the selected memory cell MC is relatively long and the corresponding bit line resistance $R_{BL}$ relatively large. During a read operation, the possibility of a current spike occurring in the selected memory cell MC may be reduced due to the relatively large IR voltage drop associated with the bit line resistance $R_{BL}$. Accordingly, when it is determined that the selected memory cell MC is relatively distant from the column selection circuit 130, the column decoder 150 will variably "set" (or define) a relatively higher voltage level for the column selection signal LY for selecting the bit line BL of the selected memory cell MC.

In contrast, when the selected memory cell MC is relatively to the column selection circuit 130, since the bit line BL of the selected memory cell MC is relatively short, the corresponding bit line resistance $R_{BL}$ will be relatively small. During a read operation, since a resulting small voltage drop occurs in relation to the bit line resistance $R_{BL}$, the possibility of a current spike occurring in the selected memory cell MC need not be addressed. Accordingly, when it is determined that the selected memory cell MC is relatively proximate to the column selection circuit 130, the column decoder 150 may set a relatively low voltage level for the column selection signal LY for selecting the bit line BL of the selected memory cell MC.

In this manner, the voltage generator 170 may apply an appropriately set (or defined) voltage level for the column selection signal LY in response to the voltage control signal CTRL_VOL (see FIG. 10) applied form the control circuit 120 during a read operation.

Figure 11:
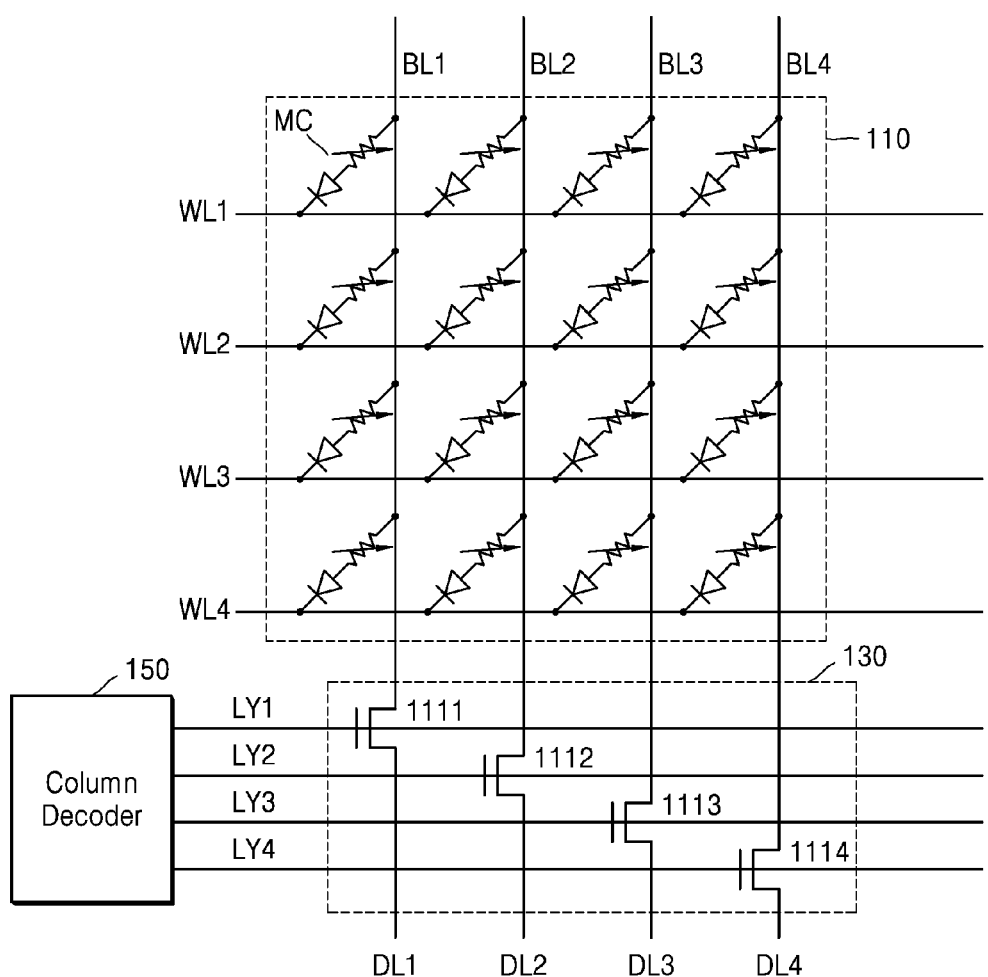
FIGS. 11, 12A and 12B are circuit diagrams illustrating in another example the operation of the memory cell array and the column selection circuit of FIG. 10.

FIG. 11 is a circuit diagram further illustrating in one example the memory cell array 110 and the column selection circuit 130 of FIG. 10.

Referring to FIG. 11, in the memory cell array 110, 1D1R type memory cells MC are disposed at intersections between four word lines, the first through fourth word lines WL1, WL2, WL3, and WL4 and four bit lines, e.g., the first through fourth bit lines BL1, BL2, BL3, and BL4. The column selection circuit 130 may include column selection transistors 1111, 1112, 1113, and 1114 respectively connected to the first through fourth bit lines BL1, BL2, BL3, and BL4. The column selection transistors 1111, 1112, 1113, and 1114 may be respectively connected to column selection signals LY1, LY2, LY3, and LY4 applied from the column decoder 150.

The column selection signals LY1, LY2, LY3, and LY4 may be applied at relatively high levels when a selected memory cell is relatively distant from the column selection circuit 130 and at relatively low levels when the selected memory cell is relatively proximate to the column selection circuit 130. The first through fourth bit lines BL1, BL2, BL3, and BL4 that are selected through the column selection transistors 1111, 1112, 1113, and 1114 that are turned ON in response to the column selection signals LY1, LY2, LY3, and LY4 may be respectively connected to the data lines DL1, DL2, DL3, and DL4.

For example, in the memory cell array 110 of FIG. 11, when the memory cell MC disposed at an intersection between the first word line WL1 and the first bit line BL1 is selected, a read operation of the selected memory cell MC will now be described with reference to FIG. 12A.

Figure 12A:
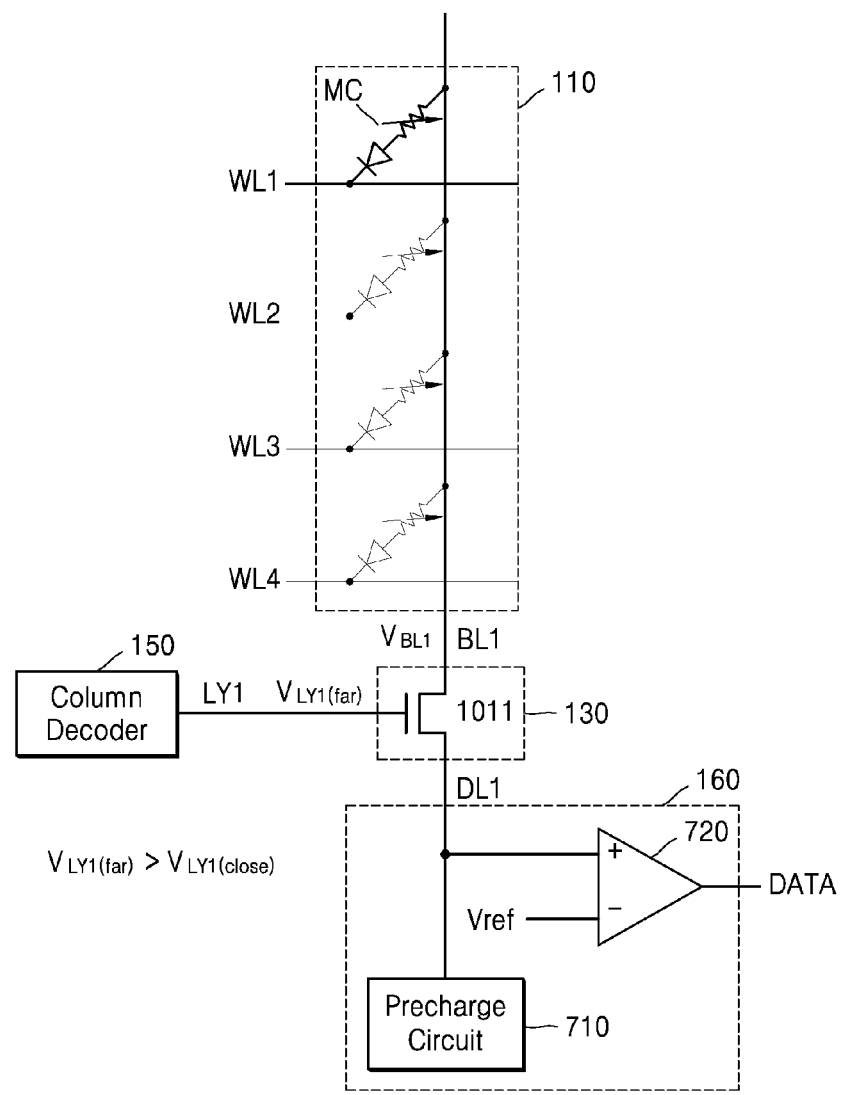

Referring to FIG. 12A, when it is determined that the memory cell MC selected by the control circuit 120 (see FIG. 10) is relatively distant from the column selection circuit 130, the column decoder 150 may apply the column selection signal LY1 having a voltage level $V_{LY1(far)}$ that is relatively high. The column selection transistor 1111 may be fully turned ON in response to the column selection signal LY1 having the voltage level $V_{LY1(far)}$, and the first bit line BL1 and the first data line DL1 may be connected through the column selection transistor 1111 that is fully turned ON.

The selected memory cell MC may be connected to the write/read circuit 160 through the first data line DL1. A precharge voltage applied to the first data line DL1 during a precharge period from the precharge circuit 710 of the write/read circuit 160 may be sufficiently transferred to the first bit line BL1 through the column selection transistor 1111. During a read operation, since a voltage of the first word line WL1 has substantially a ground voltage level, the precharge voltage may be applied to the selected memory cell MC.

Since the precharge voltage transferred to the first bit line BL1 drops due to a first bit line resistance $R_{BL1}$ that is relatively large, a current spike of the selected memory cell MC may be limited. The first bit line voltage $V_{BL1}$ may vary according to current flowing through the selected memory cell MC according to the high resistance state HRS or the low resistance state LRS of the selected memory cell MC. The first bit line voltage $V_{BL1}$ may be transferred to the first data line DL1 through the column selection transistor 1111.

The sense amplifier 720 may compare a voltage level of the first data line DL1 with the reference voltage Vref. The sense amplifier 720 may output a data value of "1" indicating that the selected memory cell MC has the high resistance state HRS as the data when the voltage level of the first data line DL1 is higher than the reference voltage Vref, and may output a data value of "0" indicating that the selected memory cell MC has the low resistance state LRS as the data when the voltage level of the first data line DL1 is lower than the reference voltage Vref.

For example, when the memory cell MC disposed at an intersection between the fourth word line WL4 and the first bit line BL1 in the memory cell array 110 of FIG. 11 is selected, a read operation of the selected memory cell MC will now be described with reference to FIG. 12B.

Figure 12B:
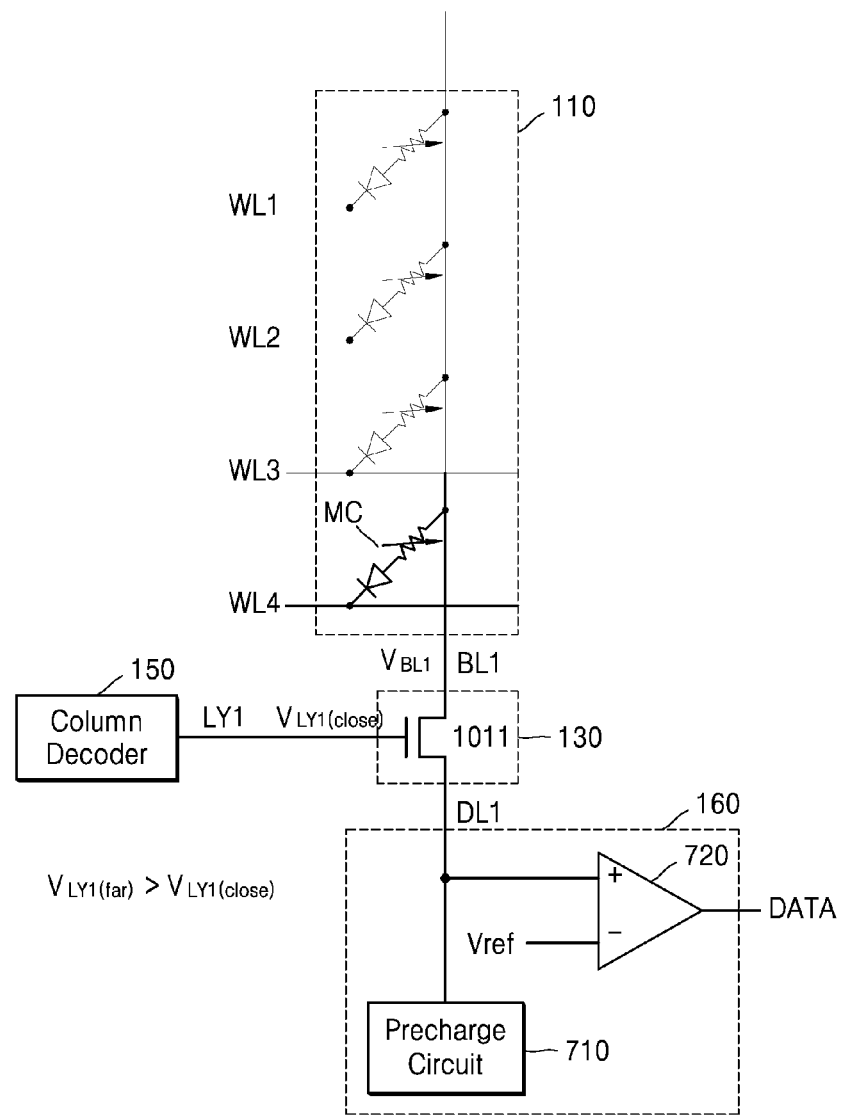

Referring to FIG. 12B, when it is determined that the memory cell MC selected by the control circuit 120 (see FIG. 10) is relatively proximate to the column selection circuit 130, the column decoder 150 may apply the column selection signal LY1 having a voltage level $V_{LY1(close)}$ that is relatively low. The column selection transistor 1111 may be partially turned ON in response to the column selection signal LY1 having the voltage level $V_{LY1(close)}$, and a precharge voltage of the first data line DL1 may be transferred to the first bit line BL1 through the column selection transistor 1111 that is partially turned ON. A voltage level of the first bit line BL1 may be lower than a precharge voltage level. During a read operation, since a voltage of the fourth word line WL4 has substantially a ground voltage level and a voltage less than the precharge voltage is applied to the selected memory cell MC, a current spike of the selected memory cell MC may be limited.

The first bit line voltage $V_{BL1}$ may vary due to current flowing through the selected memory cell MC according to the high resistance state HRS or the low resistance state LRS of the selected memory cell MC. The first bit line voltage $V_{BL1}$ may be transferred to the first data line DL1 through the column selection transistor 1111. The sense amplifier 720 may output a data value of "1" indicating that the selected memory cell MC has the high resistance state HRS as the data when a voltage level of the first data line DL1 is higher than the reference voltage Vref, and may output a data value of "0" indicating that the selected memory cell MC has the low resistance state LRS as the data when the voltage level of the first data line DL1 is lower than the reference voltage Vref.

Figure 13:
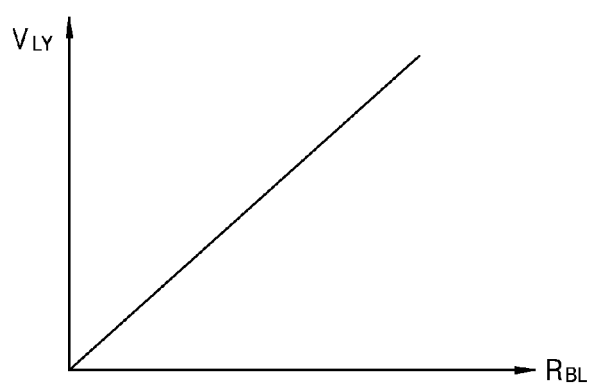

FIG. 13 is a graph and FIG. 14 is a table that collectively describe one approach to the selection (setting or defining) of a voltage level for the column selection signal according to an embodiment of the inventive concept.

Referring to FIGS. 11 and 13, the horizontal axis indicates a bit line resistance $R_{BL}$, and the vertical axis indicates a voltage level $V_{LY}$ applied to the column selection signals LY1, LY2, LY3, and LY4. The voltage level $V_{LY}$ applied to the column selection signals LY1, LY2, LY3, and LY4 may be set to a relatively high level when the selected memory cell MC is relatively distant from the column selection circuit 130 and the bit line resistance $R_{BL}$ is large. The voltage level $V_{LY}$ applied to the column selection signals LY1, LY2, LY3, and LY4 may be set to a relatively low level when the selected memory cell MC is proximate to the column selection circuit 130 and the bit line resistance $R_{BL}$ is small. The voltage level $V_{LY}$ applied to the column selection signals LY1, LY2, LY3, and LY4 may linearly increase as the bit line resistance $R_{BL}$ increases.

Referring to FIG. 14, the row address X_ADDR includes the address bits A1 through A10. The first through $1024^{th}$ word lines WL1 through WL1024 of the memory cell array 110 that are selected word lines may be activated according to the address bits A1 through A10. The column decoder 150 (see FIG. 10) may change a voltage level of the column selection signal LY by using information of predetermined address bits of the row address X_ADDR.

For example, the column decoder 150 (see FIG. 10) may divide the first through 1024$^{th}$ word lines WL1 through WL1024 into four groups, e.g., first through fourth groups, by using MSB and MSB-1 address bits of the row address X_ADDR. When memory cells connected to the first through 256$^{th}$ word lines WL1 through WL256 of the first group are selected, the column decoder 150 may apply a column selection signal LYi ('i' is a natural number) having a first voltage level $V_{LYa}$ to the column selection circuit 130. When memory cells connected to the 257$^{th}$ through 512$^{th}$ word lines WL257 through WL512 of the second group are selected, the column decoder 150 may apply the column selection signal LYi having a second voltage level $V_{LYb}$ to the column selection circuit 130. When memory cells connected to the 513$^{th}$ through 768$^{th}$ word lines WL513 through WL768 of the third group are selected, the column decoder 150 may apply the column selection signal LYi having a third voltage level $V_{LYc}$ to the column selection circuit 130. When memory cells connected to the 769$^{th}$ through 1024$^{th}$ word lines WL769 through WL1024 of the fourth group are selected, the column decoder 150 may apply the column selection signal LYi having a fourth voltage level $V_{LYd}$ to the column selection circuit 130.

Although the first through 1024$^{th}$ word lines WL1 through WL1024 are divided into four groups by using MSB address bits of the row address X_ADDR in the illustrated embodiment of FIG. 14, the inventive concept is not limited thereto and the first through 1024$^{th}$ word lines WL1 through WL1024 may, for example, be divided into various groups by using CSB or LSB address bits, instead of the MSB address bits.

When it is determined that memory cells connected to the first through 256$^{th}$ word lines WL1 through WL256 of the first group are farthest from the column selection circuit 130 and memory cells connected to the word lines WL769 through WL1024 of the fourth group are closest to the column selection circuit 130, the column decoder 150 may apply the column selection signal LYi so that the first voltage level $V_{LYa}$ is the highest and the fourth voltage level $V_{LYd}$ is the lowest. In another embodiment, when it is determined that memory cells connected to the first through 256$^{th}$ word lines WL1 through WL256 of the first group are closest to the column selection circuit 130 and memory cells connected to the word lines WL769 through WL1024 of the fourth group are farthest from the column selection circuit 130, the column decoder 150 may apply the column selection signal LYi so that the first voltage level $V_{LYa}$ is the lowest and the fourth voltage level $V_{LYd}$ is the highest.

Thus, in the foregoing embodiments the constituent control circuit may variably set the voltage level of the column selection signal according to the relative distance of a selected memory cell in view of a number of resistive memory cell groupings. That is, the control circuit may select a corresponding voltage level from among a plurality of voltage levels including a highest voltage level and a lowest voltage level, where each of the plurality of voltage levels respectively corresponds to a grouping of resistive memory cells among a plurality of resistive memory cell groupings including a most distant resistive memory cell grouping and a most proximate resistive memory cell grouping. In this manner, the control circuit may set the voltage level of the column selection signal to the highest voltage level when the selected memory cell is disposed in the most distant resistive memory cell grouping, and set the voltage level of the column selection signal to the lowest voltage level when the selected memory cell is disposed in the most proximate resistive memory cell grouping. The same is true for intermediate voltage levels between the highest and lowest voltage levels corresponding respectively to relatively proximate and distend resistive memory cell groupings.

Figure 15:
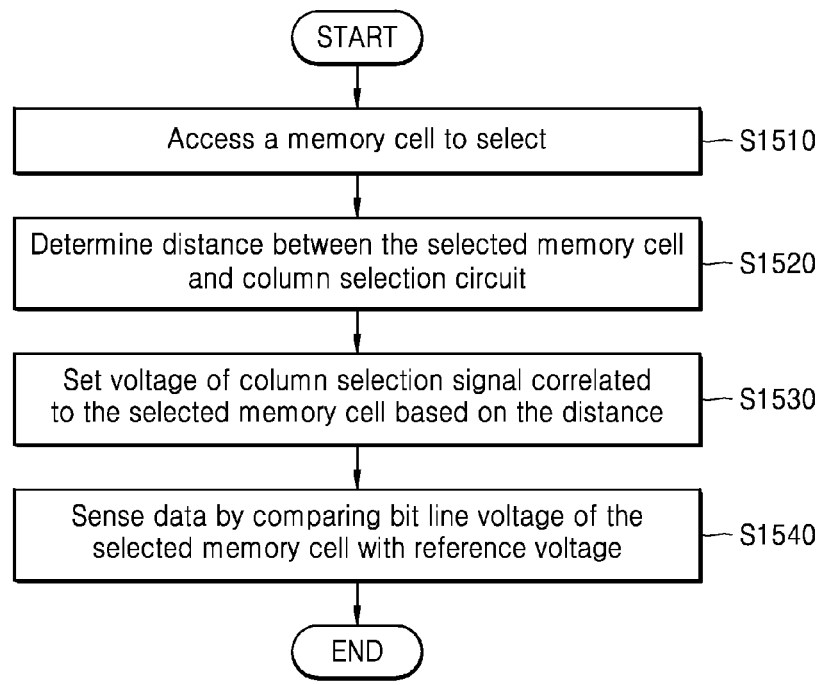
FIG. 15 is a flowchart summarizing a method of operating a memory device according to an embodiment of the inventive concept.

FIG. 15 is a flowchart summarizing a method of operating a memory device according to an embodiment of the inventive concept.

Referring collectively to FIGS. 10 through 15 inclusive, the illustrated embodiment of FIG. 15 assumes the execution of a read operation directed to selected memory cells.

In operation S1510, an access operation for selecting a memory cell may be performed. The access operation may include controlling to receive the addresses ADDR applied from the memory controller 200 (see FIG. 1), select the word line WL according to the row address X_ADDR of the received addresses ADDR, and select the bit line BL according to the column address Y_ADDR.

In operation S1520, a distance between the selected memory cell and the column selection circuit 130 may be determined. Information of a predetermined address bit (or bits) of the row address X_ADDR may be used to determine the distance between the selected memory cell and the column selection circuit 130.

In operation S1530, a voltage level applied to the column selection signal LYi of the column selection circuit 130 may be changed based on the determined distance between the selected memory cell and the column selection circuit 130. When the selected memory cell is relatively distant from the column selection circuit 130, the voltage level of the column selection signal LYi may be set to a high level, and when the selected memory cell is proximate to the column selection circuit 130, the voltage level of the column selection signal LYi may be set to a low level.

In operation S1540, data stored in the selected memory cell may be detected by comparing a reference voltage with a bit line voltage of the selected memory cell according to the high resistance state HRS or the low resistance state LRS of the selected memory cell.

Figure 16:
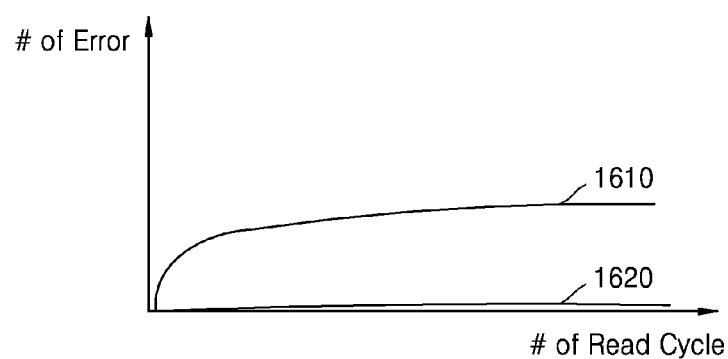
FIG. 16 is a diagram illustrating an effect of reducing read errors by using a method of operating a memory device according to embodiments.

FIG. 16 is a diagram illustrating an effect of reducing read errors by using a method of operating a memory device according to embodiments of the inventive concept.

Referring to FIG. 16, it has been determined that the number 1610 of read errors of a conventional memory device increases as the number of read cycles increases. As described with reference to FIG. 5B, it will be understood that during a read operation on memory cells, a range of a distribution of the low resistance state LRS is widened due to read disturbance caused by a current spike occurring in a memory cell, and thus the number of read errors increases as a resistance of the low resistance state LRS exceeds the threshold resistance $R_{th}$.

A column selection circuit that is relatively distant from a selected memory cell may be enabled or a voltage level applied to a column selection signal may be changed based on a distance between the selected memory cell and the column selection circuit, by using methods of operating a memory device of FIGS. 1 through 15. Accordingly, since a current spike occurring in the selected memory cell is limited due to an IR voltage drop caused by a large bit line resistance of the selected memory cell, the number 1620 of read errors of the memory device 100 hardly increases even as the number of read cycles increases.

Figure 17:
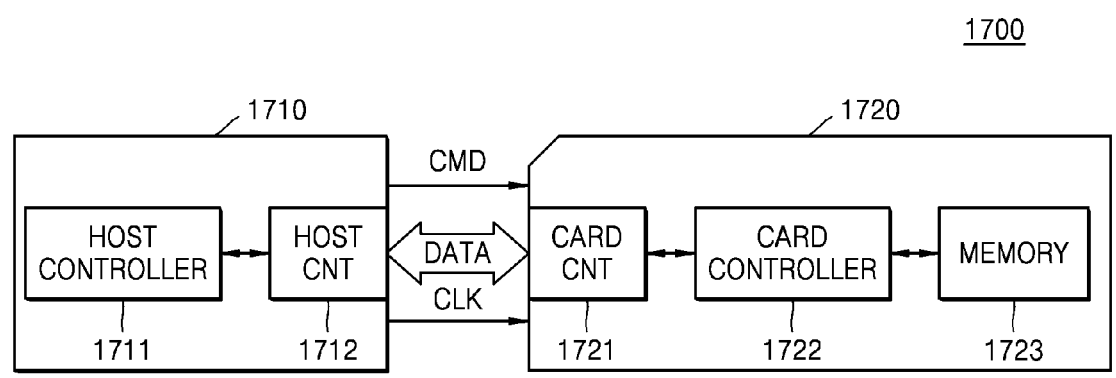
FIG. 17 is a block diagram illustrating an example where a memory system is applied to a memory card system according to embodiments.

FIG. 17 is a block diagram illustrating a memory system in the form of memory card system 1700 according to embodiments of the inventive concept.

Referring to FIG. 17, the memory card system 1700 may include a host 1710 and a memory card 1720. The host 1710 may include a host controller 1711 and a host connection unit 1712. The memory card 1720 may include a card connection unit 1721, a card controller 1722, and a memory device 1730.

The host 1710 may write data to the memory card 1720, or may read data stored in the memory card 1720. The host controller 1711 may transmit the command CMD, a clock signal CLK, and the data to the memory card 1720 through the host connection unit 1712.

The card controller 1722 may store data in the memory device 1723 in synchronization with a clock signal generated in a clock generator in the card controller 1722, in response to the command CMD received through the card connection unit 1721. The memory device 1723 may store data transmitted from the host 1710. The memory device 1723 may be implemented by using embodiments of FIGS. 1 through 15.

The memory device 1723 may be a resistive memory device including memory cells disposed at intersections between a plurality of word lines and a plurality of bit lines and each having a resistance level that varies according to stored data. The memory device 1723 may enable a column selection circuit relatively distant from a selected memory cell or change a voltage level applied to a column selection signal based on a distance between the selected memory cell and the column selection circuit. Accordingly, the memory device 1723 may reduce read disturbance by limiting current flowing through the selected memory cell due to a voltage drop according to a bit line resistance of the selected memory cell.

The memory card 1720 may be any of a compact flash card (CFC), a microdrive, a smart media card (SMC), a multimedia card (MMC), a security digital card (SDC), a memory stick, and a USB flash memory driver.

Figure 18:
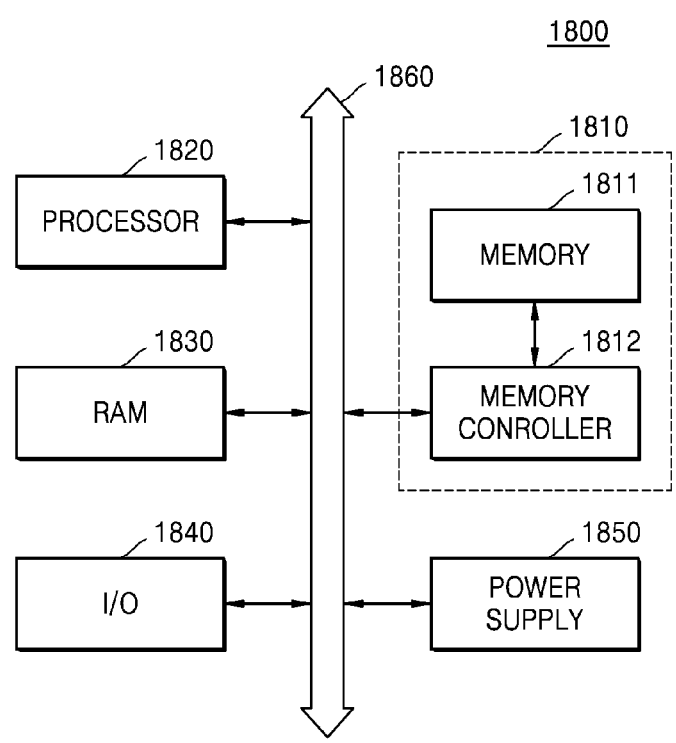
FIG. 18 is a block diagram of a computing system including a memory system according to embodiments.

FIG. 18 is a block diagram of a computing system 1800 including a memory system according to embodiments of the inventive concept.

Referring to FIG. 18, the computing system 1800 may include a memory system 1810, a processor 1820, a RAM 1830, an input/output device 1840, and a power supply device 1850. Although not shown in FIG. 18, the computing system 1800 may further include ports that may communicate with a video card, a sound card, a memory card, or a USB device or may communicate with other electronic devices. The computing system 1800 may be a PC, or may be a portable electronic device such as a notebook computer, a mobile phone, a personal digital assistant (PDA), or a camera.

The processor 1820 may perform specific calculations or tasks. According to embodiments, the processor 1820 may be a micro-processor or a central processing unit (CPU). The processor 1820 may communicate with the RAM 1830, the input/output device 1840, and the memory system 1810 through a bus 1860 such as an address bus, a control bus, or a data bus.

The memory system 1810 may include a nonvolatile memory device 1811 and a memory controller 1812. The nonvolatile memory device 1811 may be implemented by using embodiments of FIGS. 1 through 15.

The nonvolatile memory device 1811 may be a resistive memory device including memory cells disposed at intersections between a plurality of word lines and a plurality of bit lines and each having a voltage level that varies according to stored data. The nonvolatile memory device 1811 may enable a column selection circuit relatively distant from a selected memory cell or change a voltage level applied to a column selection signal based on a distance between the selected memory cell and the column selection circuit. Accordingly, the nonvolatile memory device 1811 may reduce read disturbance by limiting current flowing through the selected memory cell due to a voltage drop according to a bit line resistance of the selected memory cell.

The processor 1820 may also be connected to an expansion bus such as a peripheral component interconnect (PCI) bus. The RAM 1830 may store data needed to operate the computing system 1800. For example, the RAM 1830 may be a dynamic RAM (DRAM), a mobile DRAM, a static RAM (SRAM), a PRAM, a ferroelectric RAM (FRAM), an RRAM, and/or an MRAM. The input/output device 1840 may include an input unit such as a keyboard, a keypad, or a mouse and an output unit such as a printer or a display. The power supply device 1850 may supply an operating voltage needed to operate the computing system 1800.

Figure 19:
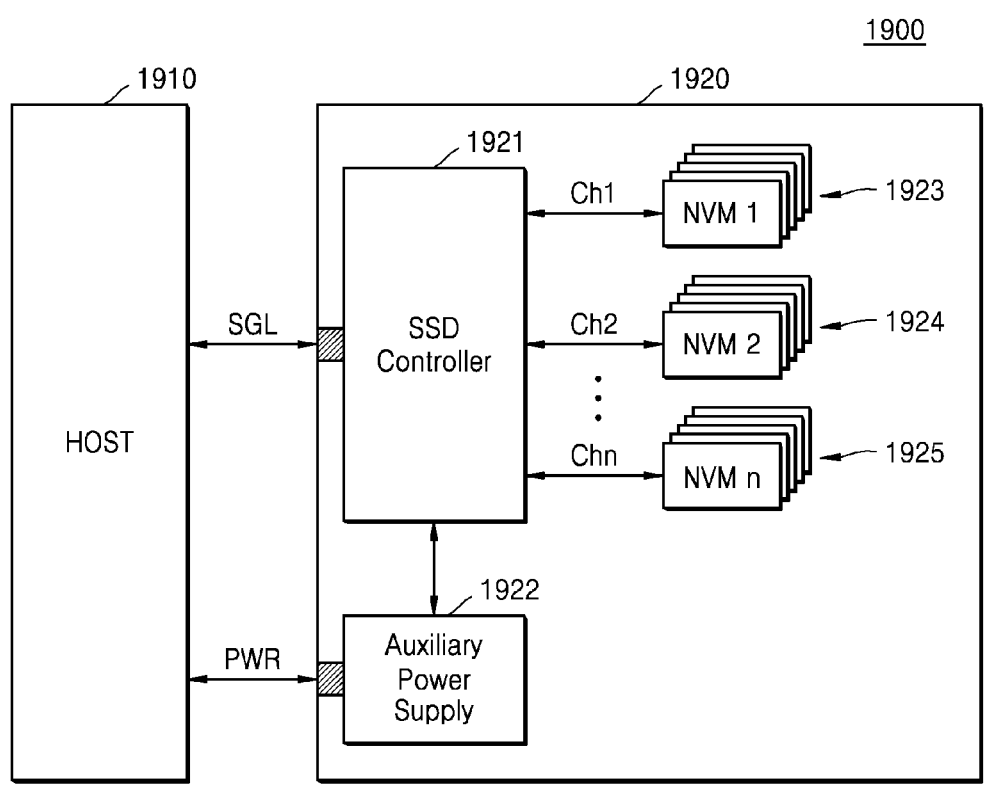
FIG. 19 is a block diagram illustrating an example where a memory system is applied to a solid-state disk/drive (SSD) system according to embodiments.

FIG. 19 is a block diagram illustrating a memory system is applied to an SSD system 1900 according to embodiments of the inventive concept.

Referring to FIG. 19, the SSD system 1900 may include a host 1910 and an SSD 1920. The SSD 1920 transmits/receives a signal to/from the host 1910 through a signal connector, and receives power through a power connector. The SSD 1920 may include an SSD controller 1921, an auxiliary power supply device 1922, and a plurality of nonvolatile memory devices 1923, 1924, and 1925. In this case, the SSD 1920 may be implemented by using embodiments of FIGS. 1 through 15.

The auxiliary power supply device 1922 is connected to the host 1910 through a power connector. The auxiliary power supply device 1922 may receive from power PWR from the host 1910 to be charged. When power supply from the host 1910 is not good, the auxiliary power supply device 1922 may supply power of the SSD system 1900. For example, the auxiliary power supply device 1922 may be disposed inside the SSD 1920 or may be disposed outside the SSD 1920. For example, the auxiliary power supply device 1922 may be disposed on a main board of the SSD system 1900 and may supply auxiliary power to the SSD 1920.

The plurality of nonvolatile memory devices 1923 through 1925 are used as storage media of the SSD 1920. The plurality of nonvolatile memory devices 1923 through 1925 may be connected to the SSD controller 1921 through a plurality of channels CH1 through CHn. One or more nonvolatile memory devices 1923 through 1925 may be connected to one of the channels CH1 through CHn.

Each of the nonvolatile memory devices 1923 through 1925 may be implemented by using embodiments of FIGS. 1 through 15. Each of the nonvolatile memory devices 1923 through 1925 may be a resistive memory device including memory cells disposed at intersections between a plurality of word lines and a plurality of bit lines and each having a resistance level that varies according to stored data. The nonvolatile memory devices 1923 through 1925 may enable a column selection circuit relatively distant from a selected memory cell or may change a voltage level applied to a column selection signal based on a distance between the selected memory cell and the column selection circuit. Accordingly, the nonvolatile memory devices 1923 through 1925 may reduce read disturbance by limiting current flowing through the selected memory cell due to a voltage drop according to a bit line resistance of the selected memory cell.

While the inventive concept has been particularly shown and described with reference to embodiments thereof, it will be understood by one of ordinary skill in the art that various changes in form and details may be made therein without departing from the spirit and scope of the following claims.

What is claimed is:

1. A resistive memory device, comprising:
   a memory cell array including a plurality of resistive memory cells connected to a plurality of word lines in a first direction and a plurality of bit lines in a second direction substantially perpendicular to the first direction, the plurality of word lines including a first word line and a second word line relatively closer to a selection circuit than the first word line, and the plurality of bit lines including a first bit line and a second bit line relatively closer to the selection circuit than the first bit line;
   the selection circuit having selection transistors, the selection transistors being turned on in response to a selection signal, the selection signal being applied to gates of the selection transistor;
   a write/read circuit configured to perform a write operation or a read operation with respect to a memory cell selected from among the plurality of resistive memory cells, the write/read circuit being connected to a plurality of data lines; and
   a control circuit configured to variably control a voltage level of the selection signal,
   wherein, when the selection transistors are connected between the plurality of data lines and the plurality of word lines, a first voltage level of the selection signal when the selected memory cell is connected to the first word line is set to be higher than a second voltage level of the selection signal when the selected memory cell is connected the second word line.

2. The resistive memory device of claim 1, wherein the control circuit determines the first word line as a distant word line from the selection circuit and determines the second word line as a proximate word line to the selection circuit.

3. The resistive memory device of claim 2, further comprising:
   a row decoder configured to selectively enable one of the plurality of word lines and generate the voltage level of the selection signal,
   wherein the voltage level of the selection signal is generated based on at least one address bit of a column address applied to the row decoder.

4. The resistive memory device of claim 1, wherein, when the selection transistors are connected between the plurality of data lines and the plurality of bit lines,
   the first voltage level of the selection signal when the selected memory cell is connected to the first bit line is set to be higher than the second voltage level of the selection signal when the selected memory cell is connected the second bit line.

5. The resistive memory device of claim 4, wherein the control circuit determines the first bit line as a distant bit line from the selection circuit and determines the second word line as a proximate bit line to the selection circuit.

6. The resistive memory device of claim 5, further comprising:
   a column decoder configured to select one of the plurality of bit lines and generate the voltage level of the selection signal,
   wherein the voltage level of the selection signal is generated based on at least one address bit of a column address applied to the column decoder.

7. The resistive memory device of claim 1, wherein the plurality of resistive memory cells comprise phase change memory cells, and each of the phase change memory cells is formed of a Ge—Sb—Te (GST) phase-change material,
   each of the plurality of resistive memory cells is a single-level memory cell (SLC) configured to store a single bit of data according to a selected one of two resistance states, and
   the memory cell array comprises a vertical three-dimensional (3D) memory.

8. The resistive memory device of claim 1, wherein the write/read circuit comprises a precharge circuit and a sense amplifier,
   the precharge circuit precharges the plurality of data lines to a voltage level of a precharge voltage during a precharge period, and
   the sense amplifier senses data stored in the selected memory cell by comparing a voltage level of a data line coupled to the selected memory cell with a voltage level of a reference voltage after the precharge period.

9. The resistive memory device of claim 8, further comprising a voltage generator electrically connected to the selection circuit and the write/read circuit,
   wherein the voltage generator generates the precharge voltage and the reference voltage and applies a set voltage level of the selection signal in response to a voltage control signal applied from the control circuit.

10. A method of operating a resistive memory device comprising a memory cell array including a plurality of resistive memory cells connected to a plurality of word lines in a first direction and a plurality of bit lines in a second direction substantially perpendicular to the first direction, the plurality of word lines including a first word line and a second word line relatively closer to a selection circuit than the first word line, and the plurality of bit lines including a first bit line and a second bit line relatively closer to the selection circuit than the first bit line, the method comprising:
    performing an access operation of selecting a memory cell from among the plurality of resistive memory cells;
    connecting the selected memory cell to a data line through the selection circuit, the selection circuit having selection transistors, each of the selection transistors being connected between a plurality of data lines and one of the plurality of word lines and the plurality of bit lines, the selection transistors being turned on in response to a column selection signal;
    determining a physical distance between the selection circuit and the selected memory cell; and
    differently applying a voltage level of the column selection signal to gates of the selection transistors based on the physical distance,
    wherein, when the selection transistors are connected between the plurality of data lines and the plurality of word lines, a first voltage level of the column selection signal when the selected memory cell is connected to the first word line is set to be higher than a second voltage level of the column selection signal when the selected memory cell is connected the second word line.

11. The method of claim 10, wherein the determining of the physical distance between the selection circuit and the selected memory cell comprises:
    determining the first word line as a distant word line from the selection circuit; and
    determining the second word line as a proximate word line to the selection circuit.

12. The method of claim 11, further comprising:
applying at least one address bit of a column address to a row decoder,
wherein the row decoder generates the voltage level of the column selection signal based on the at least one address bit of the column address.

13. The method of claim 10, wherein the determining of the physical distance between the selection circuit and the selected memory cell includes:
determining the first bit line as a distant bit line from the selection circuit; and
determining the second bit line as a proximate bit line to the selection circuit.

14. The method of claim 13, further comprising:
applying at least one address bit of a row address to a column decoder,
wherein the column decoder generates the voltage level of the column selection signal based on the at least one address bit of the row address.

15. A resistive memory device, comprising:
a memory cell array including a first resistive memory cell and a second resistive memory cell, the first resistive memory cell being connected between a first word line extending in a first direction and a first bit line extending in a second direction, and the second resistive memory cell being connected between a second word line extending in the first direction and a second bit line extending in the second direction; and
a first row selection transistor configured to connect the first word line and a read circuit, a gate node of the first row selection transistor being connected to a row decoder; and
a second row selection transistor configured to connect the second word line and the read circuit, a gate node of the second row selection transistor being connected to the row decoder,
wherein the row decoder is configured to bias the gate node of the first row selection transistor to a first select voltage level from an unselect voltage level when the first resistive memory cell is selected, and to bias the gate node of the second row selection transistor to a second select voltage level from the unselect voltage level when the second resistive memory cell is selected, and
the first select voltage level and the second select voltage level are different from each other.

16. The resistive memory device of claim 15, wherein the first resistive memory cell and the second resistive memory cell comprise SLC PRAM and are formed of Ge—Sb—Te,
the first direction and the second direction are substantially perpendicular to each other,
the row decoder is configured to receive a column address information and generate the first and second select voltage levels based on the column address information,
the column address information is configured to be received by a column decoder,
the column decoder is configured to select one of bit lines based on the column address information and not on a row address information, and
the row decoder is configured to select one of word lines based on the row address information and not on the column address information.

17. The resistive memory device of claim 16, further comprising:
a write circuit being connected to the first row selection transistor and the second row selection transistor,
wherein the read circuit comprises a sense amplifier and a precharge circuit.

18. The resistive memory device of claim 17, wherein the row decoder is configured to receive the column address information and generate the first and second select voltage levels based on the at least one of the column address information and the row address information.

19. The resistive memory device of claim 18, wherein, when the first word line and the second word line are the same and the first bit line is relatively distant to the first row selection transistor than the second bit line, a difference between the first select voltage level and the unselect voltage level is greater than a difference between the second select voltage level and the unselect voltage level.

20. The resistive memory device of claim 18, wherein, when the first bit line and the second bit line are the same and the first word line is relatively distant to the first row selection transistor than second word line, a difference between the first select voltage level and the unselect voltage level is greater than a difference between the second select voltage level and the unselect voltage level.

* * * * *